US012608049B2

(12) United States Patent
    Seo

(10) Patent No.: US 12,608,049 B2
(45) Date of Patent: Apr. 21, 2026

(54) ELECTRONIC DEVICE INCLUDING WINDOW GLASS AND METHOD FOR MANUFACTURING THE SAME

(71) Applicant: Samsung Electronics Co., Ltd., Suwon-si (KR)

(72) Inventor: Youngdeuk Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 274 days.

(21) Appl. No.: 18/456,794

(22) Filed: Aug. 28, 2023

(65) Prior Publication Data

US 2023/0400890 A1      Dec. 14, 2023

Related U.S. Application Data

(63) Continuation of application No. PCT/KR2022/004333, filed on Mar. 28, 2022.

(30) Foreign Application Priority Data

Jul. 7, 2021     (KR) ........................ 10-2021-0089084

(51) Int. Cl.
    B32B 3/02          (2006.01)
    B32B 3/08          (2006.01)
    (Continued)

(52) U.S. Cl.
    CPC .............. G06F 1/1656 (2013.01); B32B 3/08 (2013.01); H04M 1/0269 (2022.02); H05K 5/03 (2013.01)

(58) Field of Classification Search
    CPC .. B32B 3/02; B32B 3/08; B32B 3/085; B32B 17/06; H05K 5/03; G06F 1/1656
    See application file for complete search history.

(56) References Cited

U.S. PATENT DOCUMENTS

2008/0292844 A1     11/2008   Sabia et al.
2016/0233037 A1      8/2016   Lee et al.
(Continued)

FOREIGN PATENT DOCUMENTS

JP          2016006573 A      1/2016
KR         20160097106 A      8/2016
(Continued)

OTHER PUBLICATIONS

International Search Report for PCT/KR2022/004333 mailed Jul. 5, 2022, 6 pages.
(Continued)

*Primary Examiner* — Elizabeth E Mulvaney
(74) *Attorney, Agent, or Firm* — Nixon & Vanderhye P.C.

(57) ABSTRACT

According to various embodiments of the disclosure, an electronic device may comprise: a housing and a window glass. The window glass may be coupled to the housing and include a front surface, a rear surface disposed in parallel with at least a portion of the front surface, a side surface, a first chamfered surface extending from the rear surface to the side surface, and a second chamfered surface extending from the front surface to the side surface. The electronic device may comprise a coating layer coated on at least a portion of the second chamfered surface and a printed layer printed on at least a portion of the rear surface. At least a portion of the coating layer may be exposed to an outside.

17 Claims, 15 Drawing Sheets

(51) Int. Cl.
  *G06F 1/16*     (2006.01)
  *H04M 1/02*     (2006.01)
  *H05K 5/03*     (2006.01)

(56)      References Cited

U.S. PATENT DOCUMENTS

| | | | |
|---|---|---|---|
| 2017/0156227 | A1 | 6/2017 | Heo et al. |
| 2018/0220972 | A1 | 8/2018 | Jeong et al. |
| 2019/0173050 | A1* | 6/2019 | Eo ...................... H10K 59/8791 |
| 2020/0014415 | A1 | 1/2020 | Lee et al. |
| 2020/0045155 | A1 | 2/2020 | Ha et al. |
| 2020/0248016 | A1 | 8/2020 | Kim et al. |
| 2020/0262194 | A1* | 8/2020 | Shim ................... H04M 1/0266 |
| 2020/0369560 | A1* | 11/2020 | Takeda .................... B32B 7/025 |
| 2020/0401191 | A1* | 12/2020 | Lee .......................... B05D 5/06 |
| 2021/0168230 | A1* | 6/2021 | Baker ................... G06F 1/1635 |

FOREIGN PATENT DOCUMENTS

| | | | |
|---|---|---|---|
| KR | 20170064103 | A | 6/2017 |
| KR | 20180090920 | A | 8/2018 |
| KR | 101949745 | B1 | 2/2019 |
| KR | 20190066101 | A | 6/2019 |
| KR | 20190108311 | A | 9/2019 |
| KR | 20190120910 | A | 10/2019 |
| KR | 20200005834 | A | 1/2020 |
| KR | 20200015046 | A | 2/2020 |
| KR | 20210014914 | A | 2/2021 |

OTHER PUBLICATIONS

Written Opinion of the ISA for PCT/KR2022/004333 mailed Jul. 5, 2022, 4 pages.
Korean Office Action issued Apr. 30, 2025 in corresponding Korean Patent Application No. 10-2021-0089084.

* cited by examiner

ELECTRONIC DEVICE INCLUDING WINDOW GLASS AND METHOD FOR MANUFACTURING THE SAME

CROSS-REFERENCE TO RELATED APPLICATIONS

This application is a continuation of International Application No. PCT/KR2022/004333, filed on Mar. 28, 2022, in the Korean Intellectual Property Receiving Office and claiming priority to Korean Patent Application No. 10-2021-0089084, filed on Jul. 7, 2021, in the Korean Intellectual Property Office, the disclosures of which are incorporated by reference herein in their entireties.

BACKGROUND

Field

The disclosure relates to an electronic device including a window glass.

Description of Related Art

Advancing information communication and semiconductor technologies accelerate the spread and use of various electronic devices. In particular, recent electronic devices are being developed to carry out communication while carried on.

"Electronic device" may refer to a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as voices or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and/or a scheduling or e-wallet function. Such electronic devices become compact enough for users to carry in a convenient way.

As the electronic device is so diversified, the housing covering the electronic device and/or display device is also changed to have a variety of shapes and functions. For example, a front cover for covering the display panel of a display device is structured to extend up to a side portion of the electronic device to provide a functional use for expanding the internal mounting space as well as for the user's aesthetic purposes.

As a configuration of a window glass covering the front surface of an electronic device includes a curved portion, light leakage may occur in an end area of the window glass. For example, as two opposite ends of the window glass form curved portions, the light emitted from the display undergoes total reflection inside the window glass and light leakage (high lighting) may occur at the two opposite ends of the window glass whose upper end is exposed to the outside.

To precisely print a printed layer on the window glass, accurate measurement on the edges of the window glass is needed. Upon measuring the edges of the window glass, an error may frequently occur. If an error occurs, the printed layer on the window glass may be twisted. Or, an error may cause the ink to overflow, resulting in a printing defect.

It is difficult to form a printed layer on the curved portions of the window glass covering the front surface of the electronic device. In an additional process after forming a printed layer, an end of the printed layer may easily be damaged or torn. As another example, as the curved portion of the window glass faces the surrounding portion of the housing, with a gap left therebetween, the metallic housing, which has high material strength, may hit the glass plate, damaging the window glass.

SUMMARY

According to various embodiments of the disclosure, it is possible to prevent and/or reduce light leakage by coating an end area of the window glass in the electronic device.

According to various embodiments of the disclosure, it is possible to prevent and/or reduce the end portion of the printed layer and/or film layer from being torn by forming a portion of the coat on the window glass to cover the end portion of the printed layer or film layer of the display.

According to various example embodiments of the disclosure, an electronic device may comprise: a housing, a window glass coupled to the housing and including a front surface, a rear surface disposed in parallel with at least a portion of the front surface, a side surface, a first chamfered surface extending from the rear surface to the side surface, and a second chamfered surface extending from the front surface to the side surface, a coating layer coated on at least a portion of the second chamfered surface, and a printed layer printed on at least a portion of the rear surface. At least a portion of the coating layer may be exposed to an outside.

According to various example embodiments of the disclosure, a method for manufacturing an electronic device including a housing and a window glass coupled to the housing and including a front surface, a rear surface disposed in parallel with at least a portion of the front surface, a side surface, a first chamfered surface extending from the rear surface to the side surface, and a second chamfered surface extending from the front surface to the side surface may comprise: coating a coating layer on at least a portion of the second chamfered surface, printing a printed layer on at least a portion of the rear surface, and coupling the window glass to the housing. At least a portion of the coating layer may be exposed to an outside.

According to various example embodiments of the disclosure, an electronic device may comprise: a housing, a window glass coupled to the housing and including a front surface, a rear surface disposed in parallel with at least a portion of the front surface, a side surface, a first chamfered surface extending from the rear surface to the side surface, and a second chamfered surface extending from the front surface to the side surface, and a coating layer coated on at least a portion of the second chamfered surface and at least a portion of the side surface. At least a portion of the coating layer may be exposed to an outside.

According to various example embodiments of the disclosure, it is possible to prevent and/or reduce light leakage by coating an end area of the window glass in the electronic device.

According to various example embodiments of the disclosure, it is possible to provide a strength improvement effect by coating an end area of the window glass in the electronic device.

According to various example embodiments of the disclosure, it is possible to prevent and/or reduce the end portion of the printed layer and/or film layer from being torn by forming a portion of the coat on the window glass to cover the end portion of the printed layer or film layer of the display.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
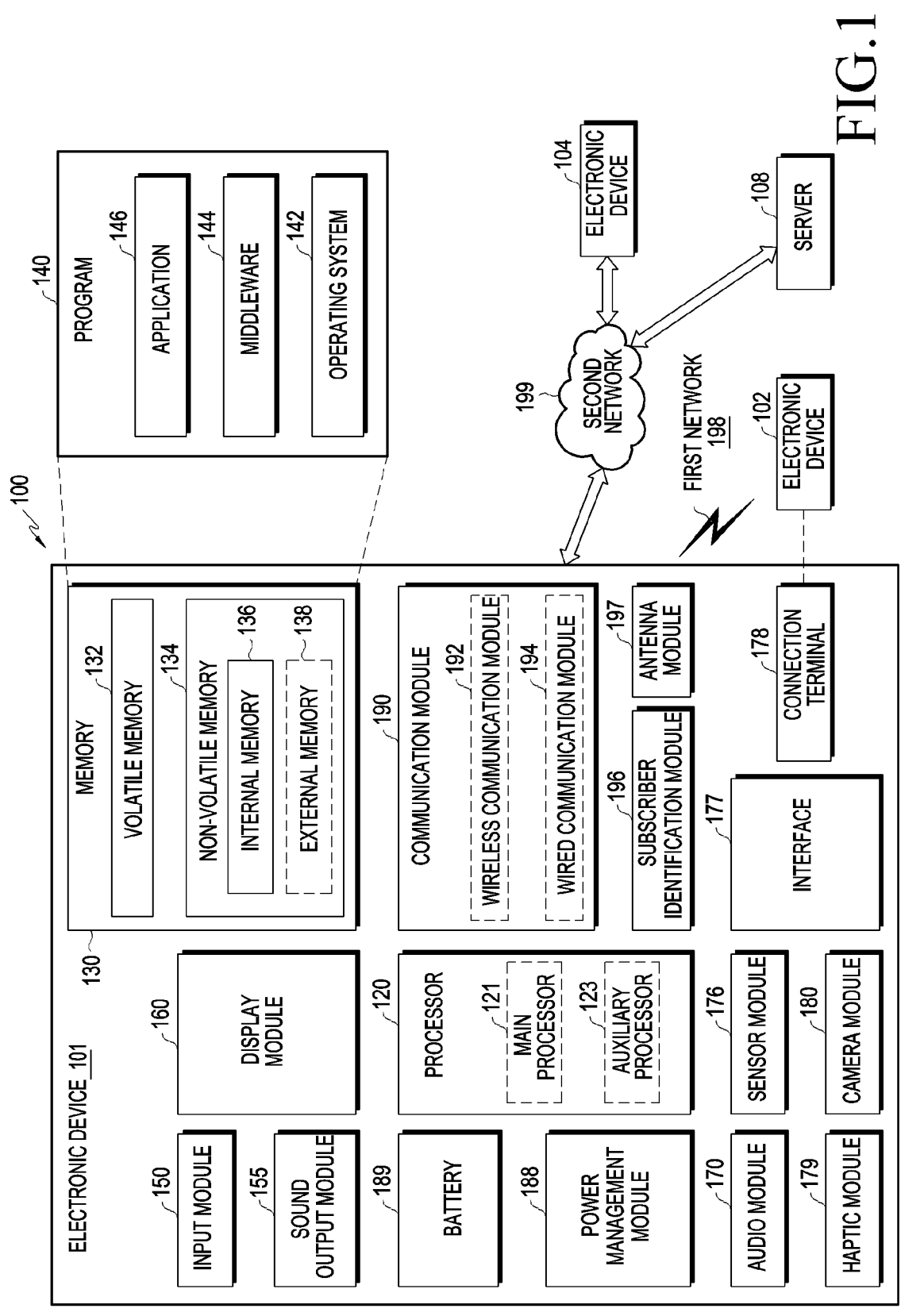
FIG. 1 is a block diagram illustrating an example electronic device in a network environment according to various embodiments.

FIG. 1 is a block diagram illustrating an example electronic device 101 in a network environment 100 according to various embodiments.

Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
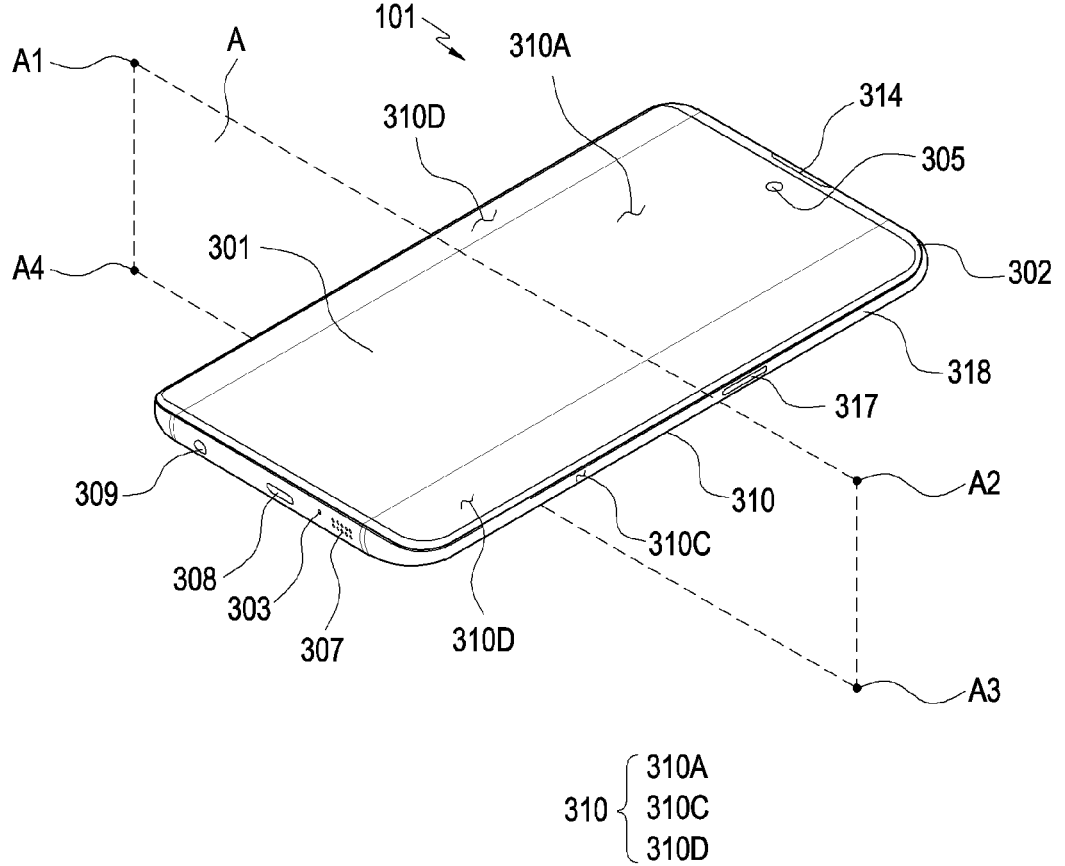
FIG. 2 is a front perspective view illustrating an electronic device according to various embodiments.
Figure 3:
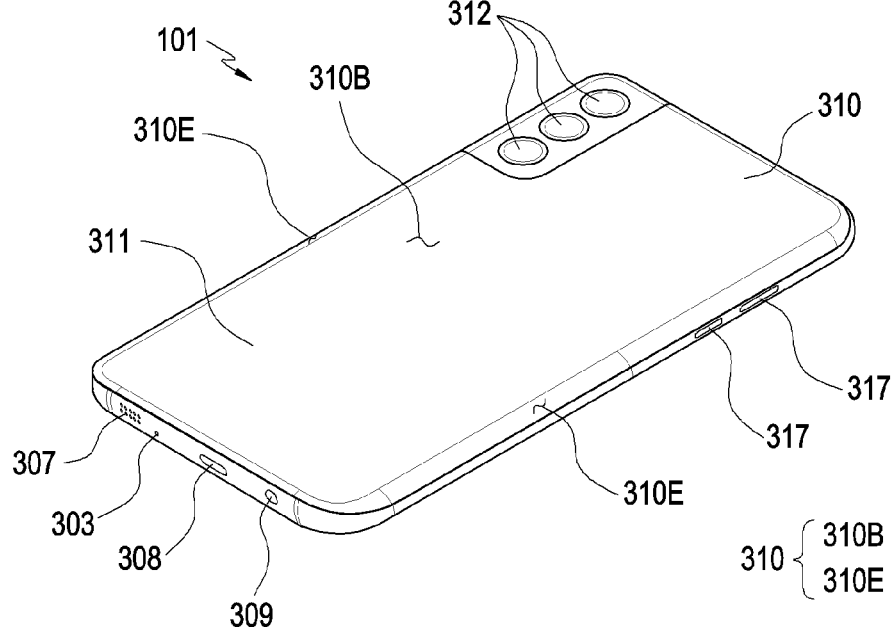
FIG. 3 is a rear perspective view illustrating an electronic device according to various embodiments.

FIG. 2 is a front perspective view illustrating an electronic device according to various embodiments. FIG. 3 is a rear perspective view illustrating an electronic device according to various embodiments;

Referring to FIGS. 2 and 3, according to an embodiment, an electronic device 101 may include a housing 310 with a front surface 310A, a rear surface 310B, and a side surface 310C surrounding a space between the front surface 310A and the rear surface 310B. According to an embodiment (not shown), the housing 310 may denote a structure forming part of the front surface 310A and side surface 310C of FIG. 2 and the rear surface 310B of FIG. 3. According to an embodiment, at least part of the front surface 310A may have a substantially transparent window glass 302 (e.g., a glass plate or polymer plate including various coat layers). The rear surface 310B may be formed by a rear plate 311. The rear plate 311 may be formed of, e.g., glass, ceramic, polymer, metal (e.g., aluminum, stainless steel (STS), or magnesium), or a combination of at least two thereof. The side surface 310C may be formed by a side bezel structure (or a "side member") 318 that couples to the window glass 302 and the rear plate 311 and includes a metal and/or polymer. According to an embodiment, the rear plate 311 and the side bezel plate 318 may be integrally formed together and include the same material (e.g., glass, metal, such as aluminum, or ceramic).

In the embodiment illustrated, the window glass 302 may include two first edge areas 310D, which seamlessly and bendingly extend from the first surface 310A to the rear plate 311, on both the long edges of the window glass 302. In the embodiment (refer to FIG. 3) illustrated, the rear plate 311 may include two second edge areas 310E, which seamlessly and bendingly extend from the rear surface 310B to the window glass 302, on both the long edges. According to an embodiment, the window glass (or the rear plate 311) may include only one of the first edge areas 310 (or the second edge areas 310E). Alternatively, the first edge areas 310D or the second edge areas 310E may partially be excluded. According to an embodiment, at side view of the electronic device 101, the side bezel structure 318 may have a first thickness (or width) for sides that do not have the first edge areas 310D or the second edge areas 310E and a second thickness, which is smaller than the first thickness, for sides that have the first edge areas 310D or the second edge areas 310E.

According to an embodiment, the electronic device 101 may include at least one of a display 301, audio modules 303, 307, and 314 (e.g., the audio module 170 of FIG. 1), a sensor module (e.g., the sensor module of FIG. 1). 176), camera modules 305 and 312 (e.g., the camera module 180 of FIG. 1), a key input device 317 (e.g., the input module 150 of FIG. 1), and connector holes 308 and 309 (e.g., the connection terminal 178 of FIG. 1). According to an embodiment, the electronic device 101 may exclude at least one (e.g., the connector hole 309) of the components or may add other components.

According to an embodiment, the display 301 may be visually exposed (e.g., visible) through, e.g., a majority portion of the window glass 302. According to an embodiment, at least a portion of the display 301 may be visible through the window glass 302 forming the front surface 310A and the first edge areas 310D. According to an embodiment, the edge of the display 301 may be formed to be substantially the same in shape as an adjacent outer edge of the window glass 302. According to an embodiment (not shown), the interval between the outer edge of the display 301 and the outer edge of the window glass 302 may remain substantially even to give a larger area of exposure the display 301.

According to an embodiment, the surface (or the window glass 302) of the housing 310 may include a screen display area formed as the display 301 is visually exposed. For example, the screen display area may include the front surface 310A and first edge areas 310D.

According to an embodiment (not shown), a recess or opening may be formed in a portion of the screen display area (e.g., the front surface 310A or the first edge area 310D) of the display 301, and at least one or more of the audio module 314, sensor module (not shown), light emitting device (not shown), and camera module 305 may be aligned with the recess or opening. According to an embodiment (not shown), at least one or more of the audio module 314, sensor module (not shown), camera module 305, fingerprint sensor (not shown), and light emitting device (not shown) may be included on the rear surface of the screen display area of the display 301. According to an embodiment (not shown), the display 301 may be disposed to be coupled with, or adjacent, a touch detecting circuit, a pressure sensor capable of measuring the strength (pressure) of touches, and/or a digitizer for detecting a magnetic field-type stylus pen. According to an embodiment, at least part of the key input device 317 may be disposed in the first edge areas 310D and/or the second edge areas 310E.

According to various embodiments, the first camera module 305 among the camera modules 305 and 312 and/or the sensor module may be disposed, in the internal space of the electronic device 101, to abut the external environment through the transmissive area of the display 301. According to an embodiment, the area facing the first camera module 305 of the display 301 may be formed as a transmissive area having a designated transmittance, as a part of the area displaying content. According to an embodiment, the transmissive area may be formed to have a transmittance in a range from about 5% to about 20%. The transmissive area may include an area overlapping an effective area (e.g., an angle-of-view area) of the first camera module 305 through which light incident on the image sensor to generate an image passes. For example, the transmissive area of the display 301 may include an area having a lower pixel density and/or wiring density than the surrounding area. For example, the transmissive area may replace a recess or opening.

According to an embodiment, the audio modules 303, 307, and 314 may include, e.g., a microphone hole 303 and speaker holes 307 and 314. The microphone hole 303 may have a microphone inside to obtain external sounds. According to an embodiment, there may be a plurality of microphones to be able to detect the direction of a sound. The speaker holes 307 and 314 may include an external speaker hole 307 and a phone receiver hole 314. In some embodiments, the speaker holes 307 and 314 and the microphone hole 303 may be implemented as a single hole, or a speaker may be included without the speaker holes 307 and 314 (e.g., a piezo speaker). The audio modules 303, 307, and 314 are not limited to the above-described structure. Depending on the structure of the electronic device 101, various design changes may be made—e.g., only some of the audio modules may be mounted, or a new audio module may be added.

According to an embodiment, the sensor modules (not shown) may generate an electrical signal or data value corresponding to an internal operating state or external environmental state of the electronic device 101. The sensor modules (not shown) may include a first sensor module (e.g., a proximity sensor) and/or a second sensor module (e.g., a fingerprint sensor) disposed on the front surface 310A of the housing 310 and/or a third sensor module (e.g., an HRM sensor) and/or a fourth sensor module (e.g., a fingerprint sensor) disposed on the rear surface 310B of the housing 310. In an embodiment (not shown), the fingerprint sensor may be disposed on the rear surface 310B as well as on the front surface 310A (e.g., the display 301) of the housing 310. The electronic device 101 may include a sensor module not shown, e.g., at least one of a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, or an illuminance sensor. The sensor modules are not limited to the above-described structure. Depending on the structure of the electronic device 101, various design changes may be made—e.g., only some of the sensor modules may be mounted, or a new sensor module may be added.

According to an embodiment, the camera modules 305 and 312 may include a first camera module 305 disposed on the front surface 310A of the electronic device 101, and a rear camera device 312 and/or a flash (not shown) disposed on the rear surface 310B. The camera modules 305 and 312 may include one or more lenses, an image sensor, and/or an image signal processor. The flash (not shown) may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 101. The camera modules 305 and 312 are not limited to the above-described structure. Depending on the structure of the electronic device 101, various design changes may be made—e.g., only some of the camera modules may be mounted, or a new camera module may be added.

According to an embodiment, the electronic device 101 may include a plurality of camera modules (e.g., a dual camera or triple camera) having different attributes (e.g., angle of view) or functions. For example, a plurality of camera modules 305 and 312 including lenses having different angles of view may be configured, and the electronic device 101 may control to change the angle of view of the camera modules 305 and 312 performed by the electronic device 101 based on the user's selection. At least one of the camera modules 305 and 312 may form, for example, a wide-angle camera and at least another of the plurality of camera modules may form a telephoto camera. Similarly, at least one of the camera modules 305 and 312 may form, for example, a front camera and at least another of the plurality of camera modules may form a rear camera. Further, the camera modules 305 and 312 may include at least one of a wide-angle camera, a telephoto camera, and an infrared (IR) camera (e.g., a time of flight (TOF) camera, a structured light camera). According to an embodiment, the IR camera may be operated as at least a portion of the sensor module. For example, the TOF camera may be operated as at least a portion of a sensor module (not shown) for detecting the distance to the subject.

According to an embodiment, the key input device 317 may be disposed on the side surface 310C of the housing 310. According to an embodiment, the electronic device 101 may exclude all or some of the above-mentioned key input devices 317 and the excluded key input devices 317 may be implemented in other forms, e.g., as soft keys, on the display 301. According to an embodiment, the key input device may include the sensor module (not shown) disposed on the second surface 310B of the housing 310.

According to an embodiment, the light emitting device (not shown) may be disposed on, e.g., the front surface 310A of the housing 310. The light emitting device (not shown) may provide, e.g., information about the state of the electronic device 101 in the form of light. According to an embodiment, the light emitting device (not shown) may provide a light source that interacts with, e.g., the front camera module 305. The light emitting device (not shown) may include, e.g., an light emitting device (LED), an infrared (IR) LED, and/or a xenon lamp.

According to an embodiment, the connector holes 308 and 309 may include, e.g., a first connector hole 308 for receiving a connector (e.g., a universal serial bus (USB)

connector) for transmitting or receiving power and/or data to/from an external electronic device and/or a second connector hole (e.g., an earphone jack) 309 for receiving a connector for transmitting or receiving audio signals to/from the external electronic device.

According to an embodiment, the first camera module 305 of the camera modules 305 and 312 and/or some of the sensor modules (not shown) may be disposed to be exposed to the outside through at least a portion of the display 301. For example, the camera module 305 may include a punch hole camera disposed inside a hole or recess formed in the rear surface of the display 301. According to an embodiment, the second camera module 312 may be disposed inside the housing 310 so that the lens is exposed to the second surface 310B of the electronic device 101. For example, the second camera module 312 may be disposed on a printed circuit board (e.g., the printed circuit board 340 of FIG. 4).

According to an embodiment, the first camera module 305 and/or the sensor module may be disposed to contact the external environment through a transparent area from the internal space of the electronic device 101 to the window glass 302 of the display 301. Further, some sensor module 304 may be disposed to perform its functions without being visually exposed through the window glass 302 in the internal space of the electronic device.

Figure 4:
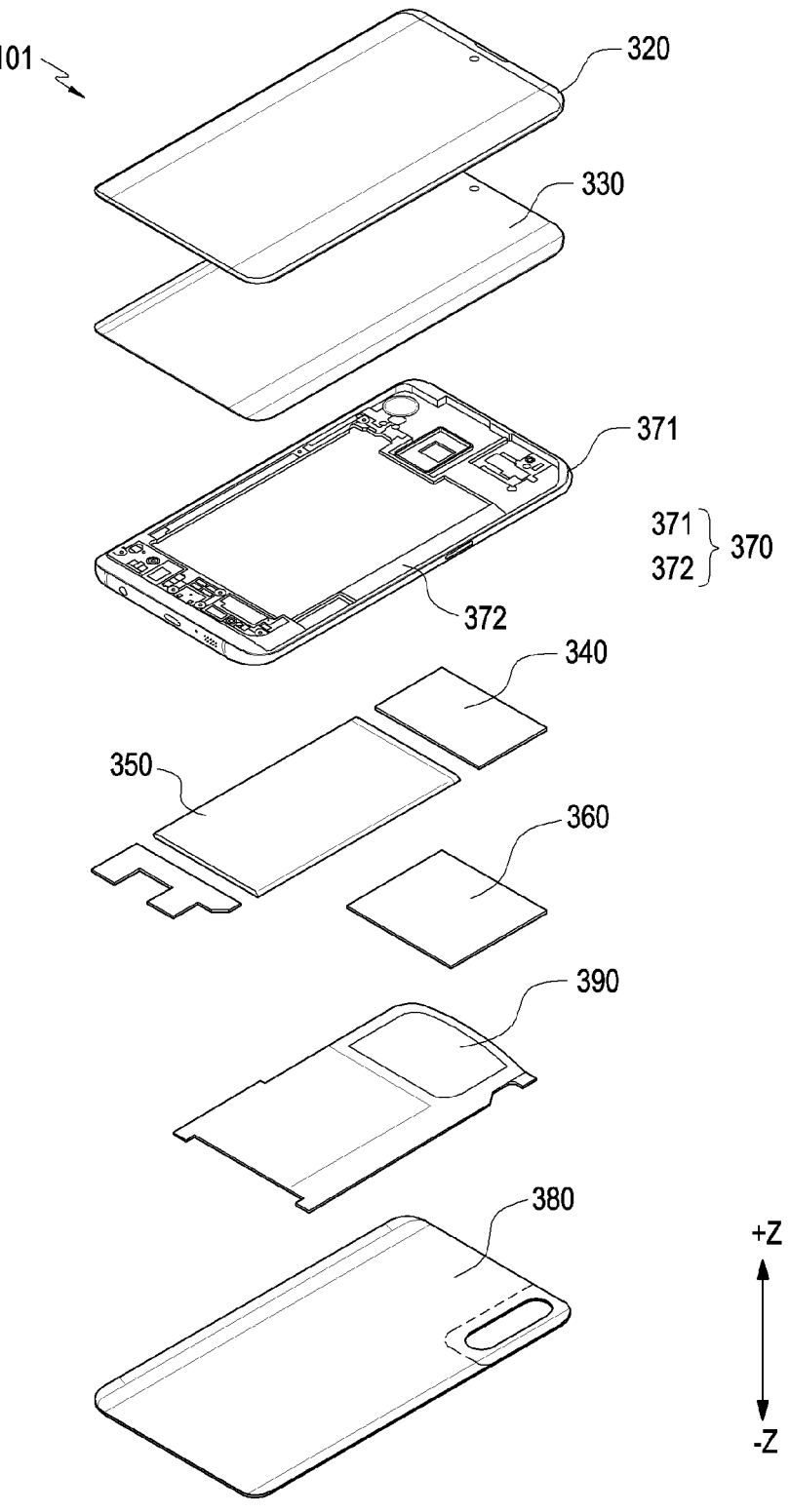
FIG. 4 is an exploded perspective view illustrating an electronic device according to various embodiments.

FIG. 4 is an exploded perspective view illustrating an electronic device according to various embodiments of the disclosure.

Referring to FIG. 4, according to various embodiments, an electronic device 101 (e.g., the electronic device 101 of FIGS. 1 to 3) may include a supporting bracket 370, a window glass 320 (e.g., the window glass 302 of FIG. 2), a display 330 (e.g., the display 301 of FIG. 2), a printed circuit board 340 (e.g., a PCB, flexible PCB (FPCB), or rigid flexible PCB (RFPCB)), a battery 350 (e.g., the battery 189 in FIG. 1), a second supporting member 360 (e.g., a rear case), an antenna 390 (e.g., the antenna module 197 of FIG. 1), and a rear plate 380 (e.g., the rear plate 311 of FIG. 2). The supporting bracket 370 of the electronic device 101 according to an embodiment may include a side bezel structure 371 (e.g., the side bezel structure 318 of FIG. 2) and a first supporting member 372.

According to an embodiment, the electronic device 101 may exclude at least one (e.g., the first supporting member 372 or second supporting member 360) of the components or may add other components. At least one of the components of the electronic device 101 may be the same or similar to at least one of the components of the electronic device 101 of FIG. 2 or 3 and no duplicate description is made below.

According to various embodiments, the first supporting member 372 may be disposed inside the electronic device 101 to be connected with the side bezel structure 371 or integrated with the side bezel structure 371. The first supporting member 372 may be formed of, e.g., a metal and/or non-metallic material (e.g., polymer). The display 330 may be joined onto one surface of the first supporting member 372, and the printed circuit board 340 may be joined onto the opposite surface of the first supporting member 311.

According to various embodiments, a processor, a memory, and/or an interface may be mounted on the printed circuit board 340. The processor may include one or more of, e.g., a central processing unit, an application processor, a graphic processing device, an image signal processing, a sensor hub processor, or a communication processor. According to various embodiments, the printed circuit board 340 may include a flexible printed circuit board type radio frequency cable (FRC). For example, the printed circuit board 340 may be disposed on at least a portion of the first supporting member 372 and may be electrically connected with an antenna module (e.g., the antenna module 197 of FIG. 1) and a communication module (e.g., the communication module 190 of FIG. 1).

According to an embodiment, the memory may include, e.g., a volatile or non-volatile memory.

According to an embodiment, the interface may include, for example, a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multi-media card (MMC) connector, or an audio connector.

According to an embodiment, the battery 350 may be a device for supplying power to at least one component of the electronic device 101. The battery 189 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

According to various embodiments, the second supporting member 360 (e.g., a rear case) may be disposed between the printed circuit board 340 and the antenna 390. For example, the second supporting member 360 may include one surface to which at least one of the printed circuit board 340 and the battery 350 is coupled, and another surface to which the antenna 390 is coupled.

According to an embodiment, the antenna 390 may be disposed between the rear plate 380 and the battery 350. The antenna 390 may include, e.g., a near-field communication (NFC) antenna, a wireless charging antenna, and/or a magnetic secure transmission (MST) antenna. The antenna 390 may perform short-range communication with, e.g., an external device or may wirelessly transmit or receive power necessary for charging. According to an embodiment, an antenna structure may be formed by a portion or combination of the side bezel structure 371 and/or the first supporting member 372.

According to various embodiments, the rear plate 380 may form at least a portion of the rear surface (e.g., the second surface 310B of FIG. 3) of the electronic device 101.

According to various embodiments of the disclosure, the electronic device 101 may include an electronic device, such as, for example, and without limitation, a foldable type, a rollable type, a sliding type, a wearable type, a tablet personal computer (PC), a note PC (or laptop), or the like. According to various embodiments of the disclosure, the electronic device 101 may include other various electronic devices without limited to the above-enumerated examples.

Figure 5A:
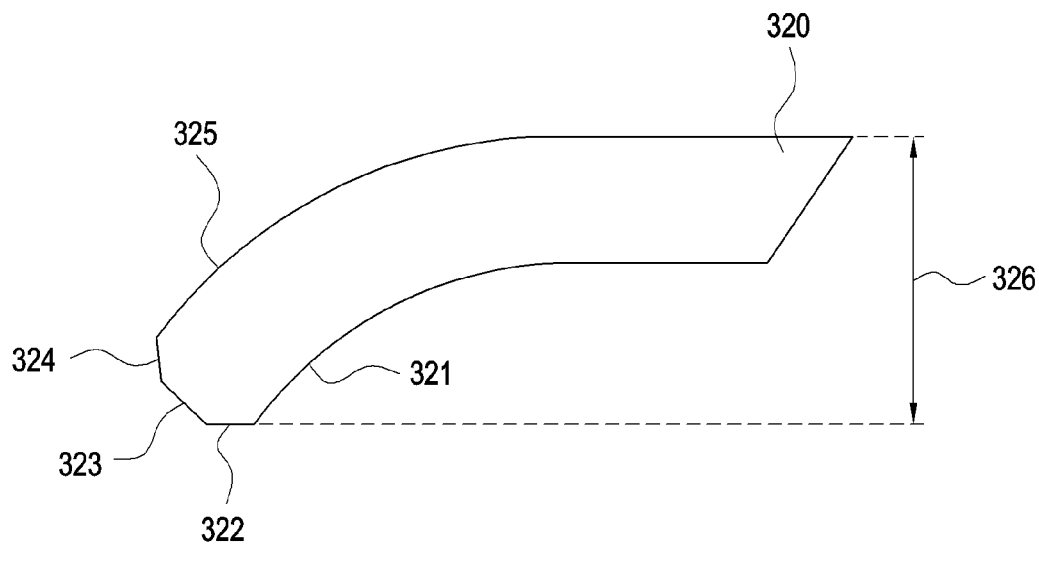
FIGS. 5A, 5B, and 5C are cross-sectional views illustrating a portion of the electronic device of FIG. 2, taken along plane A according to various embodiments.
Figure 5B:
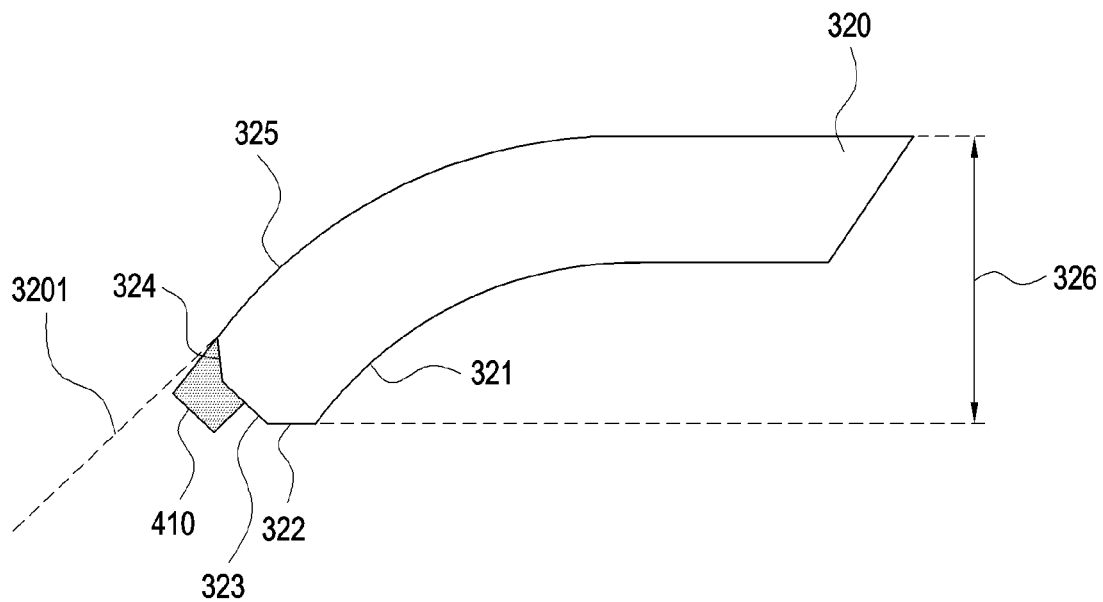
Figure 5C:
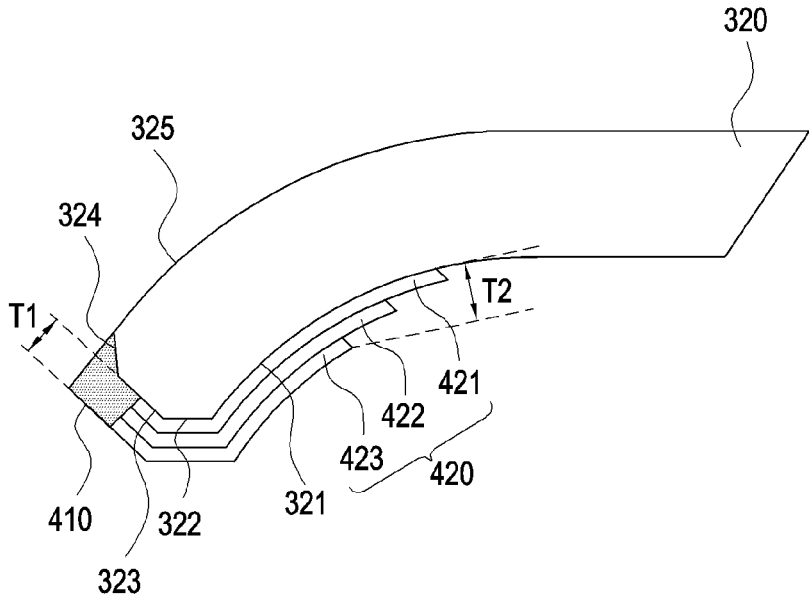

FIGS. 5A, 5B, and 5C are cross-sectional views illustrating a portion of the electronic device of FIG. 2, taken along plane A (e.g., including points A1, A2, A3 and A4 of FIG. 2) according to various embodiments.

According to various embodiments, the electronic device 101 may include a window glass 320. The window glass 320 of FIGS. 5A, 5B and 5C may be identical in whole or part to the window glass 302 or 320 illustrated in FIGS. 2, 3 and 4. Accordingly, description of the same components may not be repeated here.

Referring to FIGS. 5A, 5B and 5C, the internal structure of the electronic device 101 may be easily grasped. A plane A including points A1, A2, A3, and A4 illustrated in FIG. 2 is a plane perpendicular to the length direction of the electronic device 101. Accordingly, FIGS. 5A, 5B and 5C illustrate a portion of a cross section perpendicular to the length direction of the electronic device 101 of FIG. 2.

According to various embodiments, at least a portion of an edge of the window glass 320 may be curved. According to an embodiment, the edge of the window glass 320 may be formed to be bent toward the rear plate 380 of FIG. 4. According to an embodiment, the front and rear surfaces of the edge of the window glass 320 may be formed to be bent toward the rear plate 380. Such a shape in which at least a portion of the edge of the window glass 320 is bent toward the rear plate 380 may be referred to as a '3D shape'.

According to various embodiments, the bent edge of the window glass 320 may include a rear surface 321, a first chamfered surface 322, a side surface 323, a second chamfered surface 324, and a front surface 325. As the edge of the window glass 320 is formed to be bent toward the rear plate 380, the sagging height 326 of the window glass 320 may have a value greater than the thickness of the window glass 320.

According to various embodiments, at least a portion of the front surface of the edge of the window glass 320 may be referred to as a front surface 325, and at least a portion of the rear surface of the edge of the window glass 320 may be referred to as a rear surface 321. At least a portion of the rear surface 321 and at least a portion of the front surface 325 may be disposed to be parallel to each other. At least a portion of a side surface of the edge of the window glass 320 may be referred to as a side surface 323. The side surface 323 may be formed to form a predetermined (e.g., specified) angle with the rear surface 321 and the front surface 325. According to an embodiment, the side surface 323 may be formed to form an angle of about 90 degrees with each of the rear surface 321 and the front surface 325.

According to various embodiments, the first chamfered surface 322 extending from the rear surface 321 and the side surface 323 may be formed between the rear surface 321 and the side surface 323. The first chamfered surface 322 may be formed to form an angle of, for example, about 10 degrees to about 80 degrees with the rear surface 321. According to an embodiment, the first chamfered surface 322 may be formed to form an angle of, for example, about 45 degrees with the rear surface 321. According to an embodiment, the first chamfered surface 322 may be formed by chamfering. The first chamfered surface 322 may be configured not to be exposed to the outside of the electronic device 101.

According to various embodiments, the second chamfered surface 324 extending from the side surface 323 and the front surface 325 may be formed between the side surface 323 and the front surface 325. The second chamfered surface 324 may be formed to form an angle of, for example, about 10 degrees to about 80 degrees with the front surface 325. According to an embodiment, the second chamfered surface 324 may be formed to form an angle of, for example, about 45 degrees with the front surface 325. According to an embodiment, the second chamfered surface 324 may be formed by chamfering. At least a portion of the second chamfered surface 324 may be configured to be exposed to the outside of the electronic device 101.

According to various embodiments, the length of the first chamfered surface 322 and the second chamfered surface 324 may, for example, be in a range of about 0.05 mm to 0.15 mm. According to an embodiment, the lengths of the first chamfered surface 322 and the second chamfered surface 324 may be equal to each other. According to an embodiment, the lengths of the first chamfered surface 322 and the second chamfered surface 324 may be different from each other.

According to various embodiments, the coating layer 410 may be disposed on the edge of the window glass 320. According to an embodiment, the coating layer 410 may be disposed to be attached to at least a portion of the second chamfered surface 324 and/or at least a portion of the side surface 323 of the window glass 320. According to an embodiment, the coating layer 410 may be disposed in a dam-like shape. According to an embodiment, the coating layer 410 may be disposed in a dome-like shape. The height T1 of the coating layer 410 may, for example, be in a range of about 0.02 mm to 0.03 mm. The coating layer 410 may be disposed so as not to exceed a virtual extension line 3201 of the front surface 325 of the window glass 320. The coating layer 410 may be configured to include ink. The content of the pigment or dye included in the coating layer 410 may, for example, be in a range of about 1% to about 13%. The coating layer 410 may be formed of a transparent elastic material and/or an opaque elastic material. Further, the coating layer 410 may include an epoxy-based and/or urethane-based mixed ink. Accordingly, the coating layer 410 may serve to prevent and/or reduce print tearing. The coating layer 410 may enhance adhesion with the internal components of the electronic device 101 or perform a waterproof/moisture-proof function. The coating layer 410 may play a shielding role to visually conceal the internal configuration of the electronic device 101.

According to various embodiments, the printed layer 420 may be disposed on the edge of the window glass 320. According to an embodiment, the printed layer 420 may be disposed to be attached to at least a portion of the rear surface 321 of the window glass 320 and at least a portion of the first chamfered surface 322 and the side surface 323. The printed layer 420 may include a first printed layer 421, a second printed layer 422, and a third printed layer 423. The thickness of the first printed layer 421 may, for example, be about 0.005 mm or less, the thickness of the second printed layer 422 may, for example, be about 0.005 mm or less, and the thickness of the third printed layer 423 may, for example, be about 0.01 mm or less. Accordingly, the thickness T2 of the printed layer 420 may, for example, be in a range of about 0.01 mm to 0.02 mm. According to an embodiment, the thickness T1 of the coating layer 410 may be greater than or equal to the thickness T2 of the printed layer 420.

According to various embodiments, the thickness T1 of the coating layer 410 may be formed to be equal to or greater than the thickness of the printed layer 420 including the first printed layer 421, the second printed layer 422 and the third printed layer 423. As the thickness T1 of the coating layer 410 is formed to be equal to or greater than the thickness T2 of the printed layer 420, the coating layer 410 may function as a dam, so that the printed layer 420 is not printed on the front surface 325.

According to various embodiments, the first printed layer 421 may be disposed on at least a portion of the rear surface 321 of the window glass 320 and the first chamfered surface 322, and may be disposed on at least a portion of the side surface 323. The first printed layer 421 may be attached to the window glass 320. The content of the pigment or dye of the first printed layer 421 may, for example, be in a range of about 1% to about 10%. The first printed layer 421 may be implemented in a translucent or opaque color.

According to various embodiments, the second printed layer 422 may be disposed on the first printed layer 421. The second printed layer 422 may be disposed shorter than the first printed layer 421. Accordingly, the first printed layer 421 and the second printed layer 422 may be formed in a stepped structure. The content of the pigment or dye of the second printed layer 422 may, for example, be in a range of about 9% to about 13%. The second printed layer 422 may be implemented in an opaque color. The second printed layer 422 may perform a shielding role to visually conceal the internal configuration of the electronic device 101.

According to various embodiments, the third printed layer 423 may be disposed on the second printed layer 422. The third printed layer 423 may be disposed shorter than the second printed layer 422. Accordingly, the second printed layer 422 and the third printed layer 423 may be formed in a stepped structure. As the second printed layer 422, along with the first printed layer 421, is formed in a stepped structure, the first printed layer 421, the second printed layer 422, and the third printed layer 423 may be formed in a stepped structure. The content of the pigment or dye of the third printed layer 423 may, for example, be in a range of about 9% to about 13%. The third printed layer 423 may be implemented in an opaque color. The third printed layer 423 may enhance adhesion with the internal components of the electronic device 101 or perform a waterproof/moisture-proof function. The third printed layer 423 may perform a shielding role to visually conceal the internal configuration of the electronic device 101.

According to various embodiments, the printed layer 420 may be disposed to contact the coating layer 410. According to an embodiment, at least one of the first printed layer 421, the second printed layer 422, and the third printed layer 423 may be disposed to contact the coating layer 410.

According to various embodiments, as the coating layer 410 and the printed layer 420 are disposed on the 3D-shaped window glass 320, it is possible to suppress light leakage occurring in the 3D-shaped window glass 320, reduce defects in the coating layer 410 and the printed layer 420 of the window glass 320, and prevent and/or reduce damage to the electronic device 101 due to an external impact. Accordingly, it is possible to enhance the user's use satisfaction and the durability of the electronic device 101.

According to various embodiments, the window glass 320 on which the coating layer 410 is coated and/or the printed layer 420 is printed may be coupled with the electronic device 101. According to an embodiment, the coating layer 410 may be coupled with the housing 310 to be exposed to the outside of the electronic device 101. According to an embodiment, the coating layer 410 and/or the printed layer 420 may be disposed adjacent to the side bezel structure 318 of the electronic device 101.

Figure 6:
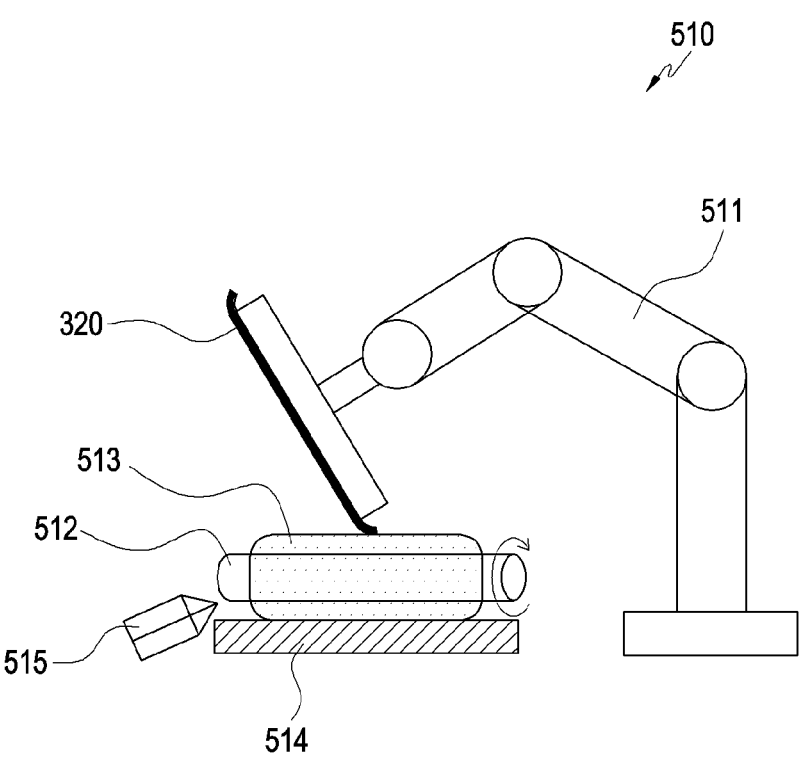
FIG. 6 is a diagram illustrating an example process for placing a coating layer on a window glass of an electronic device according to various embodiments.

FIG. 6 is a diagram illustrating an example process for placing a coating layer on a window glass of an electronic device according to various embodiments.

The window glass 320 illustrated in FIG. 6 may be identical in whole or part or similar to the window glass 320 illustrated in FIGS. 4, 5A, 5B and 5C. Accordingly, description of the same components may not be repeated here.

According to various embodiments, the coating device 510 may include an articulated robot 511, a rotary roller 512, an ink solution 513, a squeegee 514, and an ink supply syringe 515.

According to various embodiments, the articulated robot 511 may grip the window glass 320. The window glass 320 gripped by the articulated robot 511 may be tilted while forming an inclination with the floor surface as the articulated robot 511 moves. The window glass 320 may be disposed adjacent to the rotary roller 512, described below, and come into contact with the rotary roller 512.

According to various embodiments, the rotary roller 512 may have a cylindrical shape. The rotary roller 512 may contact the window glass 320 while rotating. According to an embodiment, the rotary roller 512 may contact at least a portion of the window glass 320. According to an embodiment, the outer circumstantial surface of the rotary roller 512 may contact at least a portion of the second chamfered surface 324 of the window glass 320. According to an embodiment, the outer circumstantial surface of the rotary roller 512 may contact at least a portion of the side surface 323 of the window glass 320. The ink solution 513, described below, may be applied to the outer circumferential surface of the rotary roller 512.

According to various embodiments, the ink solution 513 may be applied to the outer circumferential surface of the rotary roller 512. The content of the pigment or dye included in the ink solution 513 may, for example, be in a range of about 1% to about 13%. Further, the ink solution 513 may include an epoxy-based and/or urethane-based mixed ink. The ink solution 513 is applied to the outer circumferential surface of the rotary roller 512 and comes into contact with the window glass 320, so that the ink solution 513 may be applied to at least a portion of the side surface 323 of the window glass 320 and/or at least a portion of the second chamfered surface 324. The height of the ink solution 513 applied to the window glass 320 may, for example, be in a range of about 0.02 mm to about 0.03 mm. The height of the ink solution 513 applied to the window glass 320 may be adjusted by the squeegee 514 described below. The ink solution 513 applied to the window glass 320 may be formed into the coating layer 410 through a predetermined (e.g., specified) process.

According to various embodiments, the squeegee 514 may be disposed adjacent the rotary roller 512. A distance between the squeegee 514 and the rotary roller 512 may be adjusted. As the distance between the squeegee 514 and the rotary roller 512 may be adjusted, the height of the ink solution 513 applied to the window glass 320 may be adjusted. The ink solution 513 applied to the window glass 320 may be supplied by the ink supply syringe 515 described below.

According to various embodiments, the ink supply syringe 515 may be disposed adjacent to the rotary roller 512 and the squeegee 514. Ink may be received in the ink supply syringe 515. The ink contained in the ink supply syringe 515 may be discharged from the ink supply syringe 515, as the ink solution 513 applied to the rotary roller 512.

Figure 7:
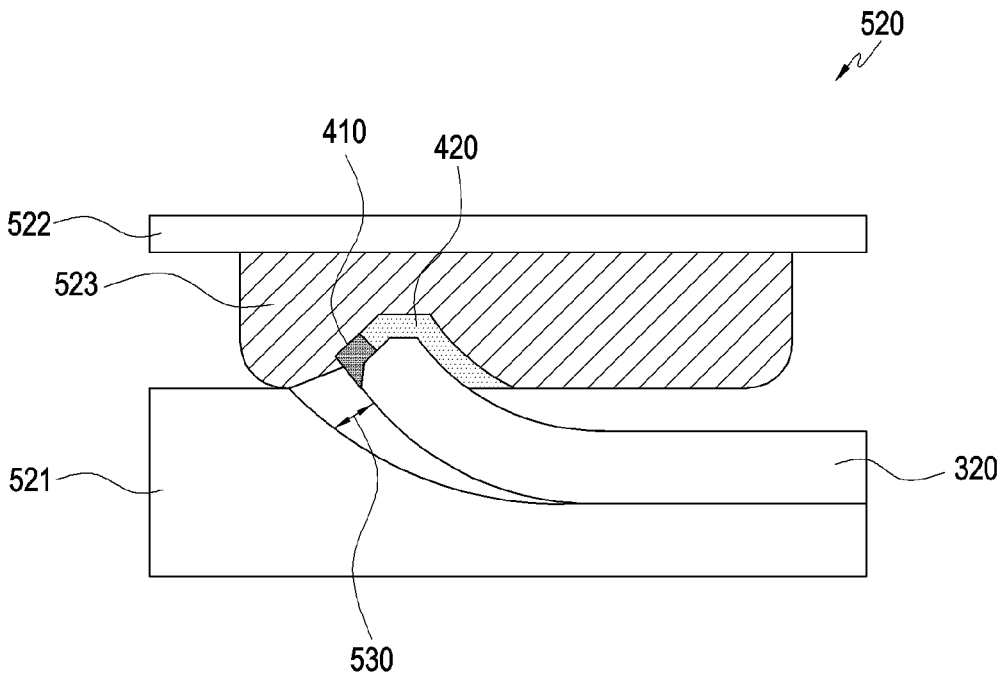
FIG. 7 is a diagram illustrating an example process for placing a printed layer on a window glass of an electronic device according to various embodiments.

FIG. 7 is a diagram illustrating an example process for placing a printed layer on a window glass of an electronic device according to various embodiments.

The window glass 320 and the coating layer 410 illustrated in FIG. 7 may be identical in whole or part or similar to the window glass 320 illustrated in FIGS. 4, 5A, 5B, 5C and 6 and may be identical in whole or part or similar to the coating layer 410 illustrated in FIGS. 5B and 5C. Accordingly, description of the same components may not be repeated here.

According to various embodiments, a printing device 520 may include a printing jig 521, a silicone pad fixing member 522, and a silicone pad 523.

According to various embodiments, the window glass 320 may be disposed on the printing jig 521 such that at least a portion of the front surface of the window glass 320 on which the coating layer 410 is disposed contacts the printing jig 521. The printing jig 521 may include a flat section in which at least a portion thereof is flat and a curved section in which at least a portion thereof is bent. The curvature of the curved section of the printing jig 521 may be different from the curvature of the curved edge of the window glass 320. According to an embodiment, the curvature of the curved section may be greater than the curvature of the edge of the window glass 320. Accordingly, the printing jig 521 and the window glass 320 may be spaced apart, forming a protection distance 530. As the protection distance 530 is formed, when the printed layer 420 is disposed on the window glass 320 through the printing device 520, damage to the window glass 320 may be prevented and/or reduced.

According to various embodiments, the silicone pad fixing member 522 may be disposed on the printing jig 521 and the window glass 320. Accordingly, the window glass 320 may be disposed between the printing jig 521 and the silicone pad fixing member 522. The silicone pad fixing member 522 may be movable up and down. Accordingly, the distance between the silicone pad fixing member 522 and the window glass 320 and the printing jig 521 may be adjusted. The silicone pad 523 described below may be disposed below the silicone pad fixing member 522 to be attached and/or fixed thereto.

According to various embodiments, as the silicone pad 523 is disposed to be attached and/or fixed to the lower side of the silicone pad fixing member 522, the silicone pad 523 may be disposed between the silicone pad fixing member 522 and the window glass 320 and the printing jig 521. Ink may be applied to the lower side of the silicone pad 523. As the silicone pad 523 moves, the ink applied to the lower side of the silicone pad 523 may contact at least a portion of the window glass 320. As at least a portion of the window glass 320 and the applied ink come into contact with each other, the ink may be printed on at least a portion of the window glass 320. The ink printed on at least a portion of the window glass 320 may be formed into a printed layer 420 through a predetermined (e.g., specified) process.

According to various embodiments, the printed layer 420 may include a first printed layer 421, a second printed layer 422, and a third printed layer 423. The first printed layer 421, the second printed layer 422, and the third printed layer 423 may be sequentially disposed through the printing device 520 so that the first printed layer 421, the second printed layer 422 and the third printed layer 423 are stacked.

According to various embodiments, the first printed layer 421 may be disposed on at least a portion of the rear surface 321 of the window glass 320, the first chamfered surface 322, and at least a portion of the side surface 323. The second printed layer 422 may be disposed on an outer surface of the first printed layer 421. The length of the second printed layer 422 may be shorter than the length of the first printed layer 421. Accordingly, the first printed layer 421 and the second printed layer 422 may be formed in a stepped structure. The third printed layer 423 may be disposed on an outer surface of the second printed layer 422. The length of the third printed layer 423 may be shorter than the length of the second printed layer 422. Accordingly, the first printed layer 421, the second printed layer 422, and the third printed layer 423 may be formed in a stepped structure.

According to various embodiments, the printed layer 420 may be disposed to contact the coating layer 410. According to an embodiment, at least one of the first printed layer 421, the second printed layer 422, and the third printed layer 423 may be disposed to contact the coating layer 410. As such, as the printed layer 420 is disposed which is equal to or less than the height T1 of the coating layer 410 after the coating layer 410 is disposed, the printed layer 420 may not be disposed on the second chamfered surface 324 and/or the front surface 325 of the window glass 320. Further, as the coating layer 410 and the printed layer 420 are sequentially disposed on the window glass 320, the printed layer 420 may be precisely disposed. As the printed layer 420 is precisely disposed, a printing defect rate of the window glass 320 may be reduced.

Figure 8:
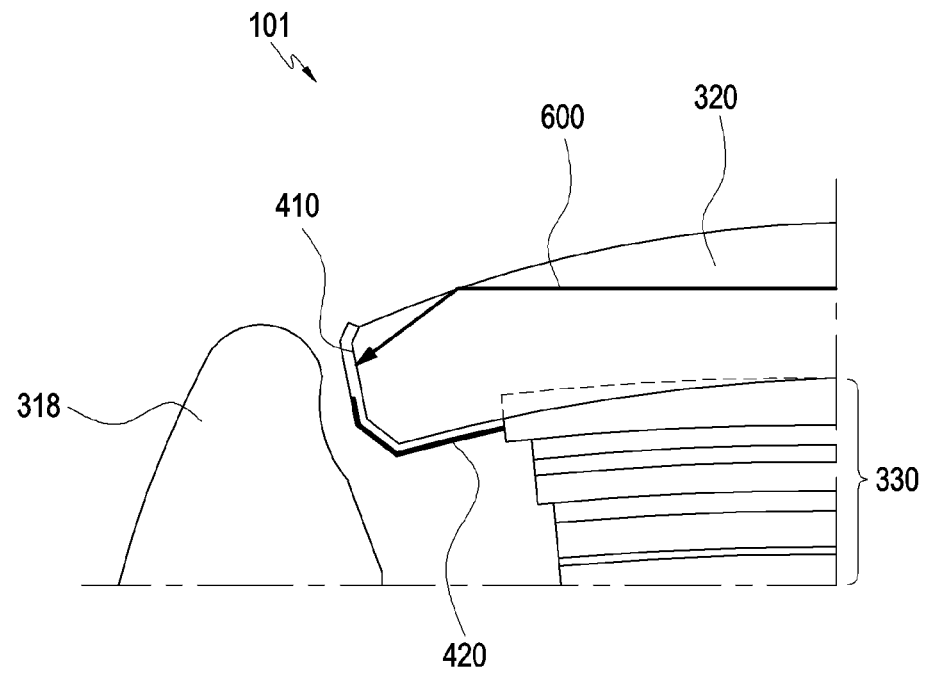
FIG. 8 is a cross-sectional view of a display and a window glass on which a side bezel structure, a coating layer, and a printed layer are disposed, according to various embodiments.

FIG. 8 is a cross-sectional view of a display and a window glass on which a side bezel structure, a coating layer, and a printed layer are disposed, according to various embodiments.

The side bezel structure 318, the window glass 320, and the display 330 shown in FIG. 8 may be identical in whole or part or similar to the side bezel structure 318 shown in FIG. 2, the window glass 320 shown in FIGS. 4, 5A, 5B and 5C, and the display 330 shown in FIG. 4. Accordingly, description of the same components may not be repeated here.

Referring to FIG. 8, an electronic device 101 may include a side bezel structure 318, a window glass 320, and a display 330. The window glass 320 may be disposed on the display 330, and that side bezel structure 318 may be placed on a side surface of the display 330.

According to various embodiments, the light 600 emitted from the display 330 may be incident into the window glass 320. The light 600 incident on the window glass 320 may be reflected in the inside of the window glass 320 and propagate to the side surface of the window glass 320. The light 600 propagating to the side surface of the window glass 320 may be shielded by the coating layer 410 and the printed layer 420 disposed on the rear surface 321 to the second chamfered surface 324 of the window glass 320. Accordingly, the light 600 passing through the rear surface 321 to the second chamfered surface 324 may disappear (or not be visible). As described above, as the coating layer 410 and the printed layer 420 shield the light 600 propagating to the side surface of the window glass 320, the light leakage occurring in the window glass 320 may be suppressed, allowing for a better-finished electronic device 101 and increasing user satisfaction.

According to various embodiments, as the coating layer 410 and the printed layer 420 are disposed on the side surface of the window glass 320, the coating layer 410 and the printed layer 420 may perform a function of absorbing external shocks. According to an embodiment, an external impact transferred from the side bezel structure 318 to the window glass 320 may be reduced while being transferred through the coating layer 410 and the printed layer 420. As the external impact is reduced and transferred to the window glass 320, the amount of movement of the window glass 320 may be reduced, and the degree of tearing and/or breakage of the coating layer 410 and the printed layer 420 may be decreased. Accordingly, durability of the electronic device 101 and user satisfaction may be increased.

According to various embodiments, as the coating layer 410 and the printed layer 420 are disposed on the side surface of the window glass 320, foreign substances introduced into the electronic device 101 may be reduced. Accordingly, the degree of contamination of the electronic device 101 may be reduced, and the durability of the electronic device 101 and user satisfaction may be increased.

Figure 9A:
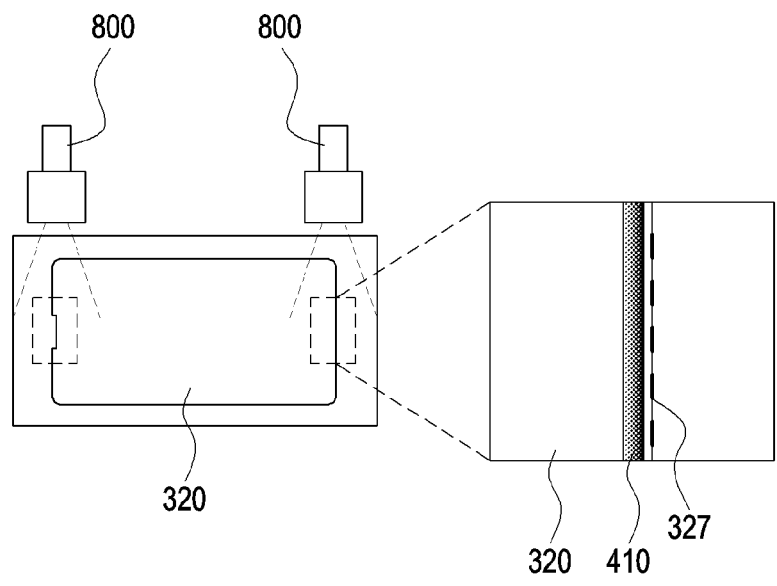
FIGS. 9A and 9B are diagrams illustrating an example process for inspecting a window glass on which a coating layer is disposed according to various embodiments.
Figure 9B:
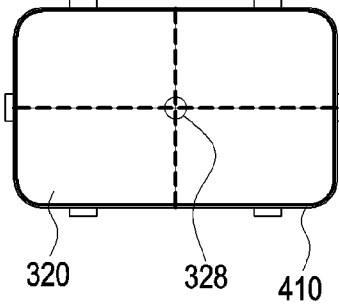

FIGS. 9A and 9B are diagrams illustrating an example process for inspecting a window glass on which a coating layer is disposed according to various embodiments.

The window glass 320 on which the coating layer 410 shown in FIGS. 9A and 9B may be identical or similar to the window glass 320 on which the coating layer 410 is disposed as shown in FIG. 5B. Accordingly, description of the same components may not be repeated here.

Referring to FIGS. 9A and 9B, according to various embodiments, the window glass 320 on which the coating layer 410 is disposed may be optically recognized through the camera 800. From the image of the window glass 320 recognized through the camera 800, the boundary of the window glass 320 may be detected. As at least a portion of the side surface 323 is disposed on the periphery of the window glass 320 and/or the coating layer 410 is disposed on at least a portion of the second chamfered surface 324, the boundary of the window glass 320 may be more precisely detected. According to an embodiment, the camera 800 may more precisely detect the interface 327 based on the coating layer 410 of the window glass 320.

According to various embodiments, as the interface 327 of the window glass 320 is more accurately detected, the window glass 320 may be precisely disposed on the printing device 520. Accordingly, the printing device 520 may accurately place the printed layer 420 on the window glass 320 based on the detected interface 327. Accordingly, as the coating layer 410 is disposed on the window glass 320, the printed layer 420 may be precisely printed, so that the printing defect rate of the printed layer 420 may be reduced.

According to various embodiments, a center point 328 may be more accurately printed through the detected interface 327 of the window glass 320. As the printing layer 420 is printed based on the accurately printed center point 328, the printed layer 420 may be printed more precisely. Further, the printing overflow of the printed layer 420 may be suppressed.

Figure 10A:
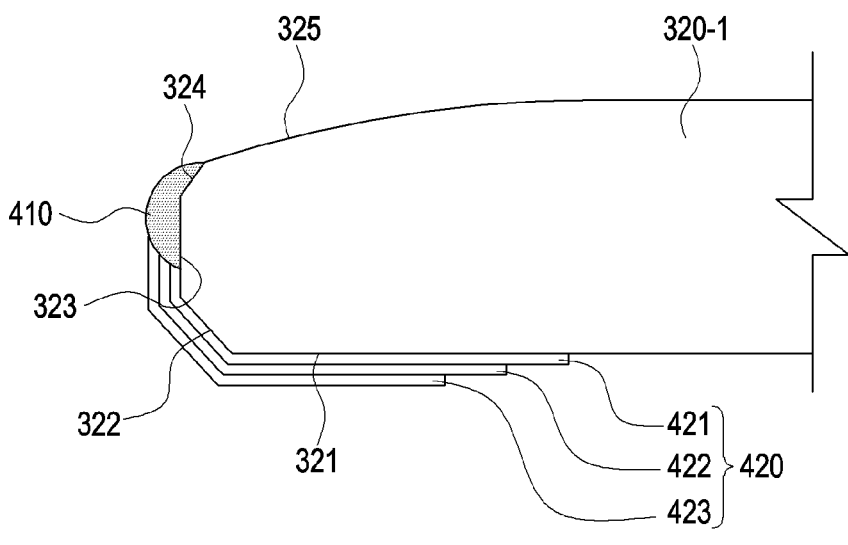
FIGS. 10A and 10B are cross-sectional views illustrating a portion of the electronic device of FIG. 2, taken along plane A according to various embodiments.
Figure 10B:
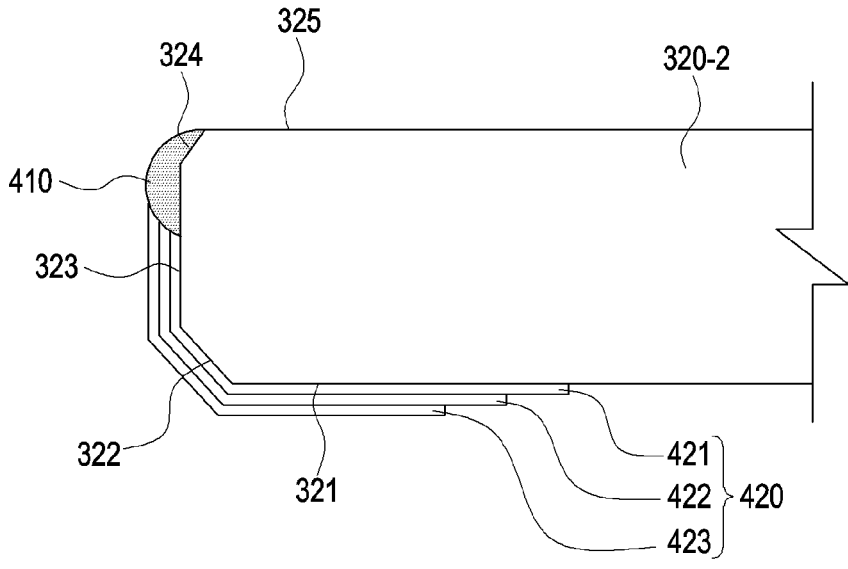

FIGS. 10A and 10B are cross-sectional views illustrating a portion of the electronic device of FIG. 2, taken along plane A according to various embodiments.

The window glass 320-1, the coating layer 410, and the printed layer 420 shown in FIGS. 10A and 10B may be identical or similar to the window glass 320, the coating layer 410 and the printed layer 420 shown in FIGS. 5A, 5B and 5C. Accordingly, description of the same components may not be repeated here.

Referring to FIG. 10A, according to various embodiments, at least a portion of the front surface of the edge of the window glass 320-1 may be formed to be curved, and the rear surface of the edge of the window glass 320-1 may be formed to be flat. Such a shape in which one of the front and rear surfaces of the edge of the window glass 320-1 is bent toward the rear plate (380 of FIG. 4) may be referred to as a '2.5D shape'.

According to various embodiments, at least a portion of the window glass 320-1 may be formed to be bent toward the rear plate 380. According to an embodiment, the rear surface 321 of the window glass 320-1 may be flat, and the front surface 325 may be formed to be bent toward the rear plate 380.

According to various embodiments, the coating layer 410 may be disposed on the edge of the window glass 320-1. According to an embodiment, the coating layer 410 may be disposed to be attached to at least a portion of the second chamfered surface 324 and/or at least a portion of the side surface 323. According to an embodiment, the coating layer 410 may be disposed in a dam-like shape. According to an embodiment, the coating layer 410 may be disposed in a dome-like shape.

According to various embodiments, the printed layer 420 may be disposed on the edge of the window glass 320-1. According to an embodiment, the printed layer 420 may be disposed to be attached to at least a portion of the rear surface 321 of the window glass 320-1 and at least a portion of the first chamfered surface 322 and the side surface 323.

The printed layer 420 may include a first printed layer 421, a second printed layer 422, and a third printed layer 423.

According to various embodiments, the first printed layer 421 may be disposed to be attached to at least a portion of the rear surface 321 of the window glass 320-1 and the first chamfered surface 322, and may be disposed to be attached to at least a portion of the side surface 323.

According to various embodiments, the second printed layer 422 may be disposed to be attached to the outer surface of the first printed layer 421. The second printed layer 422 may be shorter than the first printed layer 421. Accordingly, the first printed layer 421 and the second printed layer 422 may be formed in a stepped structure.

According to various embodiments, the third printed layer 423 may be disposed to be attached to the outer surface of the second printed layer 422. The third printed layer 423 may be shorter than the second printed layer 422. Accordingly, the second printed layer 422 and the third printed layer 423 may be formed in a stepped structure. Accordingly, the first printed layer 421, the second printed layer 422, and the third printed layer 423 may form a stepped structure.

According to various embodiments, the printed layer 420 may be disposed to contact the coating layer 410. According to an embodiment, at least one of the first printed layer 421, the second printed layer 422, and the third printed layer 423 may be disposed to contact the coating layer 410.

According to various embodiments, when viewed in a direction perpendicular to the side surface, the coating layer 410 may be formed to overlap the printed layer 420.

According to various embodiments, as the coating layer 410 and the printed layer 420 are disposed on the 2.5D-shaped window glass 320-1, it is possible to suppress light leakage occurring in the 2.5D-shaped window glass 320-1, reduce defects in the print on the window glass 320-1, and prevent and/or reduce damage to the electronic device 101 due to an external impact. Accordingly, it is possible to enhance the user's use satisfaction and the durability of the electronic device 101.

Referring to FIG. 10B, according to various embodiments, the front and rear surfaces of the edge of the window glass 320-2 may be formed to be flat. Such a shape in which the front and rear surfaces of the edge of the window glass 320-2 are flat may be referred to as a '2D shape'.

According to various embodiments, the front and rear surfaces of the window glass 320-2 may be flat. According to an embodiment, the rear surface 321 and the front surface 325 of the window glass 320-2 may be formed to be flat.

According to various embodiments, the coating layer 410 may be disposed on the edge of the window glass 320-2. According to an embodiment, the coating layer 410 may be disposed to be attached to at least a portion of the second chamfered surface 324 and/or at least a portion of the side surface 323. According to an embodiment, the coating layer 410 may be disposed in a dam-like shape. According to an embodiment, the coating layer 410 may be disposed in a dome-like shape.

According to various embodiments, the printed layer 420 may be disposed on the edge of the window glass 320-2. According to an embodiment, the printed layer 420 may be disposed to be attached to at least a portion of the rear surface 321 of the window glass 320-2 and at least a portion of the first chamfered surface 322 and the side surface 323. The printed layer 420 may include a first printed layer 421, a second printed layer 422, and a third printed layer 423.

According to various embodiments, the first printed layer 421 may be disposed to be attached to at least a portion of the rear surface 321 of the window glass 320-2 and the first chamfered surface 322, and may be disposed to be attached to at least a portion of the side surface 323.

According to various embodiments, the second printed layer 422 may be disposed to be attached to the outer surface of the first printed layer 421. The length of the second printed layer 422 may be shorter than the length of the first printed layer 421. Accordingly, the first printed layer 421 and the second printed layer 422 may be formed in a stepped structure.

According to various embodiments, the third printed layer 423 may be disposed to be attached to the outer surface of the second printed layer 422. The length of the third printed layer 423 may be shorter than the length of the second printed layer 422. Accordingly, the second printed layer 422 and the third printed layer 423 may be formed in a stepped structure. Accordingly, the first printed layer 421, the second printed layer 422, and the third printed layer 423 may form a stepped structure.

According to various embodiments, the printed layer 420 may be disposed to contact the coating layer 410. According to an embodiment, at least one of the first printed layer 421, the second printed layer 422, and the third printed layer 423 may be disposed to contact the coating layer 410.

According to various embodiments, as the coating layer 410 and the printed layer 420 are disposed on the 2D-shaped window glass 320-2, it is possible to suppress light leakage occurring in the 2D-shaped window glass 320-2 and defects in the print on the window glass 320-2 and prevent and/or reduce damage to the electronic device 101 due to an external impact. Accordingly, it is possible to enhance the user's use satisfaction and the durability of the electronic device 101.

FIGS. 11A, 11B, 11C, and 11D are cross-sectional views illustrating a portion of the electronic device of FIG. 2, taken along plane A according to various embodiments.

The window glasses 320-3, 320-4, 320-5 and 320-6 (which may be referred to as glasses 320-3 to 320-6), the coating layer 410, and the printed layer 420 shown in FIGS. 11A, 11B, 11C and 11D (which may be referred to as FIGS. 11A to 11D) may be identical or similar to the window glasses 320, 320-1, and 320-2, the coating layer 410, and the printed layer 420 shown in FIGS. 5A, 5B and 5C and 10A and 10B. Accordingly, description of the same components may not be repeated here.

Although the window glasses 320-3 to 320-6 shown in FIGS. 11A to 11D have the 2D shape, embodiments of the window glasses 320-3 to 320-6 are not limited to the 2D shape, but may rather include embodiments for the 2.5D shape and the 3D shape.

Figure 11A:
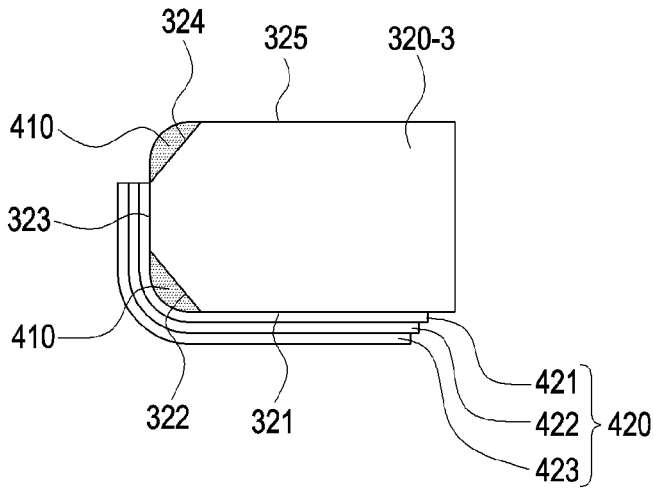
FIGS. 11A, 11B, 11C, and 11D are cross-sectional views illustrating a portion of the electronic device of FIG. 2, taken along plane A according to various embodiments.

Referring to FIG. 11A, according to various embodiments, the coating layer 410 may be disposed on the edge of the window glass 320-3. According to an embodiment, the coating layer 410 may be disposed to be attached to at least a portion of the first chamfered surface 322 and/or at least a portion of the second chamfered surface 324. According to an embodiment, the coating layer 410 may be disposed in a dam-like shape. According to an embodiment, the coating layer 410 may be disposed in a dome-like shape.

According to various embodiments, the printed layer 420 may be disposed on the edge of the window glass 320-3. According to an embodiment, the printed layer 420 may be disposed to be attached to at least a portion of the rear surface 321 of the window glass 320-3, the coating layer 410 disposed on at least a portion of the first chamfered surface 322, and at least a portion of the side surface 323 of the window glass 320-3. The printed layer 420 may include a first printed layer 421, a second printed layer 422, and a third printed layer 423.

According to various embodiments, the first printed layer 421 may be disposed to be attached to at least a portion of the rear surface 321 of the window glass 320-3, the coating layer 410 disposed on the first chamfered surface 322, and at least a portion of the side surface 323.

According to various embodiments, the second printed layer 422 may be disposed to be attached to the outer surface of the first printed layer 421. The length of the second printed layer 422 may be shorter than the length of the first printed layer 421. Accordingly, the first printed layer 421 and the second printed layer 422 may be formed in a stepped structure.

According to various embodiments, the third printed layer 423 may be disposed to be attached to the outer surface of the second printed layer 422. The length of the third printed layer 423 may be shorter than the length of the second printed layer 422. Accordingly, the second printed layer 422 and the third printed layer 423 may be formed in a stepped structure. Accordingly, the first printed layer 421, the second printed layer 422, and the third printed layer 423 may form a stepped structure.

According to various embodiments, the printed layer 420 may be disposed to contact the coating layer 410. According to an embodiment, at least one of the first printed layer 421, the second printed layer 422, and the third printed layer 423 may be disposed to contact the coating layer 410.

According to various embodiments, as the coating layer 410 is disposed on at least a portion of the first chamfered surface 322 of the window glass 320-3, and the printed layer 420 is disposed on the coating layer 410 disposed on at least a portion of the first chamfered surface 322 of the window glass 320-3, it is possible to prevent and/or reduce entry of external contaminants into the electronic device 101 and damage to the electronic device 101 due to external impact.

Figure 11B:
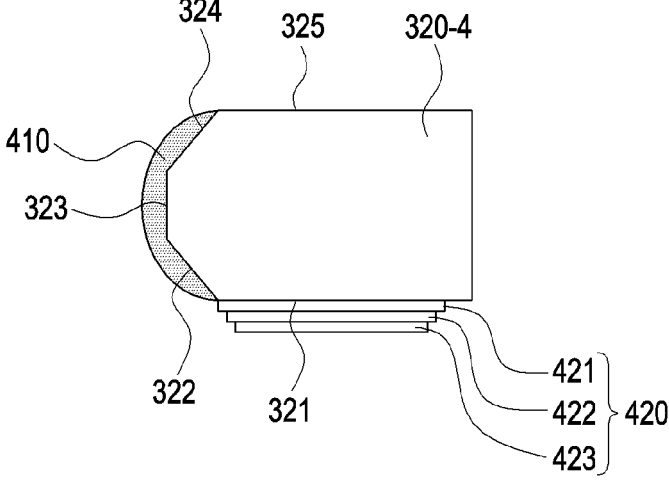

Referring to FIG. 11B, according to various embodiments, the coating layer 410 may be disposed on the edge of the window glass 320-4. According to an embodiment, the coating layer 410 may be disposed to be attached to at least a portion of the first chamfered surface 322, the side surface 323, and/or at least a portion of the second chamfered surface 324. According to an embodiment, the coating layer 410 may be disposed in a dam-like shape. According to an embodiment, the coating layer 410 may be disposed in a dome-like shape.

According to various embodiments, the printed layer 420 may be disposed on the edge of the window glass 320-4. According to an embodiment, the printed layer 420 may be disposed to be attached to at least a portion of the rear surface 321 of the window glass 320-4. The printed layer 420 may include a first printed layer 421, a second printed layer 422, and a third printed layer 423.

According to various embodiments, the first printed layer 421 may be disposed to be attached to at least a portion of the rear surface 321 of the window glass 320-4.

According to various embodiments, the second printed layer 422 may be disposed to be attached to the outer surface of the first printed layer 421. The length of the second printed layer 422 may be shorter than the length of the first printed layer 421. Accordingly, the first printed layer 421 and the second printed layer 422 may be formed in a stepped structure.

According to various embodiments, the third printed layer 423 may be disposed to be attached to the outer surface of the second printed layer 422. The length of the third printed layer 423 may be shorter than the length of the second printed layer 422. Accordingly, the second printed layer 422 and the third printed layer 423 may be formed in a stepped structure.

Accordingly, the first printed layer 421, the second printed layer 422, and the third printed layer 423 may form a stepped structure.

According to various embodiments, the printed layer 420 may be disposed to contact the coating layer 410. According to an embodiment, at least one of the first printed layer 421, the second printed layer 422, and the third printed layer 423 may be disposed to contact the coating layer 410.

According to various embodiments, as the coating layer 410 is disposed on at least a portion of the first chamfered surface 322 of the window glass 320-4, the side surface 323, and/or at least a portion of the second chamfered surface 324, and the printed layer 420 is disposed on at least a portion of the rear surface 321 of the window glass 320-4, it is possible to prevent and/or reduce entry of external contaminants into the electronic device 101 and damage to the electronic device 101 due to external impact.

Figure 11C:
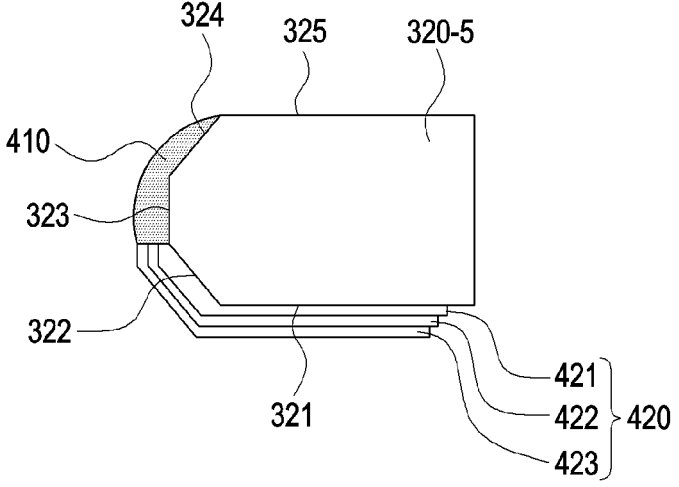

Referring to FIG. 11C, according to various embodiments, the coating layer 410 may be disposed on the edge of the window glass 320-5. According to an embodiment, coating layer 410 may be disposed to be attached to the side surface 323 and/or at least a portion of the second chamfered surface 324. According to an embodiment, the coating layer 410 may be disposed in a dam-like shape. According to an embodiment, the coating layer 410 may be disposed in a dome-like shape.

According to various embodiments, the printed layer 420 may be disposed on the edge of the window glass 320-5. According to an embodiment, the printed layer 420 may be disposed to be attached to at least a portion of the rear surface 321 of the window glass 320-5 and/or at least a portion of the first chamfered surface 322. The printed layer 420 may include a first printed layer 421, a second printed layer 422, and a third printed layer 423.

According to various embodiments, the first printed layer 421 may be disposed to be attached to at least a portion of the rear surface 321 of the window glass 320-5 and/or at least a portion of the first chamfered surface 322.

According to various embodiments, the second printed layer 422 may be disposed to be attached to the outer surface of the first printed layer 421. The length of the second printed layer 422 may be shorter than the length of the first printed layer 421. Accordingly, the first printed layer 421 and the second printed layer 422 may be formed in a stepped structure.

According to various embodiments, the third printed layer 423 may be disposed to be attached to the outer surface of the second printed layer 422. The length of the third printed layer 423 may be shorter than the length of the second printed layer 422. Accordingly, the second printed layer 422 and the third printed layer 423 may be formed in a stepped structure. Accordingly, the first printed layer 421, the second printed layer 422, and the third printed layer 423 may form a stepped structure.

According to various embodiments, the printed layer 420 may be disposed to contact the coating layer 410. According to an embodiment, at least one of the first printed layer 421, the second printed layer 422, and the third printed layer 423 may be disposed to contact the coating layer 410.

According to various embodiments, as the coating layer 410 is disposed on at least a portion of the side surface 323 of the window glass 320-5 and/or at least a portion of the second chamfered surface 324, and the printed layer 420 is disposed on at least a portion of the rear surface 321 of the window glass 320-4 and/or at least a portion of the first chamfered surface 322, it is possible to prevent and/or reduce entry of external contaminants into the electronic device 101 and damage to the electronic device 101 due to external impact.

Figure 11D:
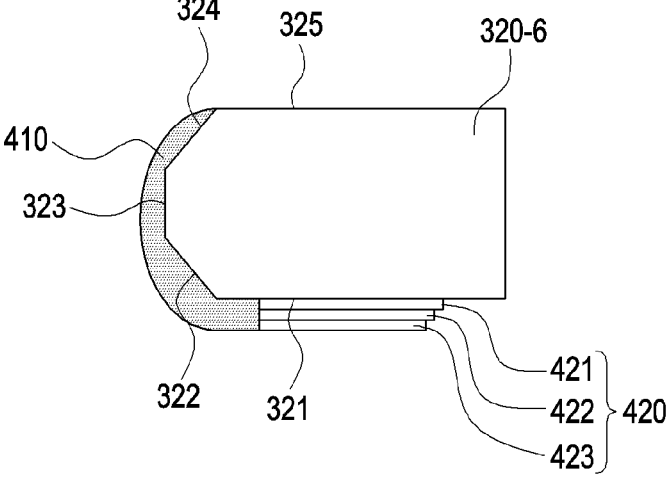

Referring to FIG. 11D, according to various embodiments, the coating layer 410 may be disposed on the edge of the window glass 320-6. According to an embodiment, the coating layer 410 may be disposed to be attached to at least a portion of the rear surface 321, the first chamfered surface 322, the side surface 323, and/or at least a portion of the second chamfered surface 324. According to an embodiment, the coating layer 410 may be disposed in a dam-like shape. According to an embodiment, the coating layer 410 may be disposed in a dome-like shape.

According to various embodiments, the printed layer 420 may be disposed on the edge of the window glass 320-6. According to an embodiment, the printed layer 420 may be disposed to be attached to at least a portion of the rear surface 321 of the window glass 320-5. The printed layer 420 may include a first printed layer 421, a second printed layer 422, and a third printed layer 423.

According to various embodiments, the first printed layer 421 may be disposed to be attached to at least a portion of the rear surface 321 of the window glass 320-6.

According to various embodiments, the second printed layer 422 may be disposed to be attached to the outer surface of the first printed layer 421. The length of the second printed layer 422 may be shorter than the length of the first printed layer 421. Accordingly, the first printed layer 421 and the second printed layer 422 may be formed in a stepped structure.

According to various embodiments, the third printed layer 423 may be disposed to be attached to the outer surface of the second printed layer 422. The length of the third printed layer 423 may be shorter than the length of the second printed layer 422. Accordingly, the second printed layer 422 and the third printed layer 423 may be formed in a stepped structure. Accordingly, the first printed layer 421, the second printed layer 422, and the third printed layer 423 may form a stepped structure.

According to various embodiments, the printed layer 420 may be disposed to contact the coating layer 410. According to an embodiment, at least one of the first printed layer 421, the second printed layer 422, and the third printed layer 423 may be disposed to contact the coating layer 410.

According to various embodiments, as the coating layer 410 is disposed on at least a portion of the rear surface 321 of the window glass 320-6, the first chamfered surface 322, the side surface 323, and/or at least a portion of the second chamfered surface 324, and the printed layer 420 is disposed on at least a portion of the rear surface 321 of the window glass 320-4, it is possible to prevent and/or reduce entry of external contaminants into the electronic device 101 and damage to the electronic device 101 due to external impact.

Figure 12A:
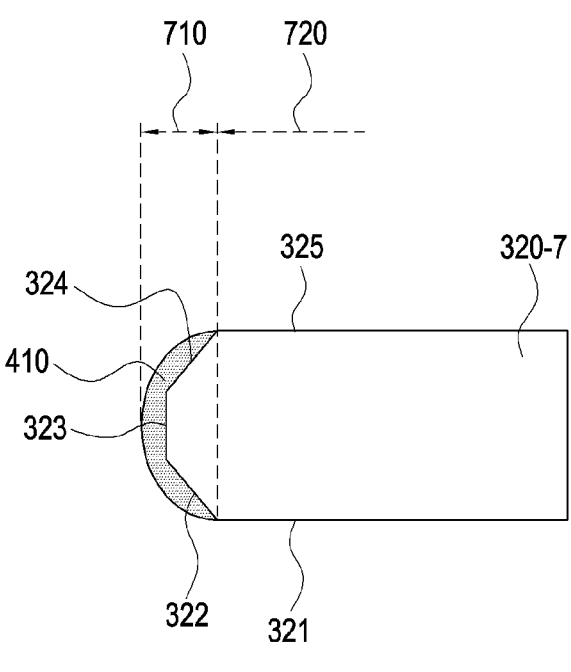
FIGS. 12A and 12B are cross-sectional views illustrating a portion of the electronic device of FIG. 2, taken along plane A according to various embodiments.
Figure 12B:
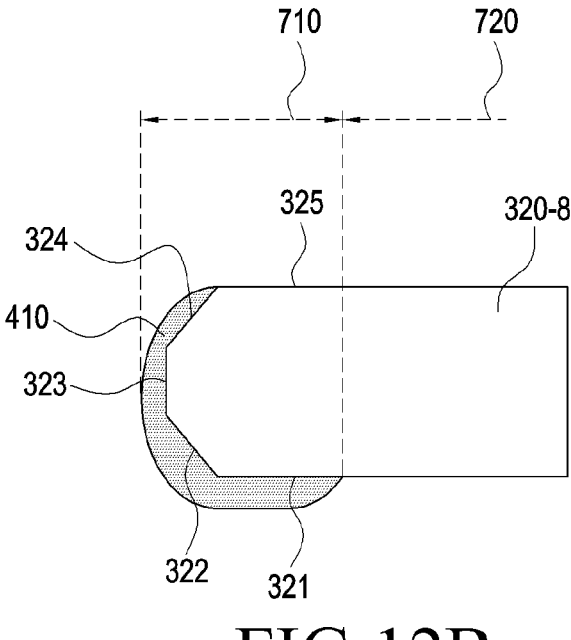

FIGS. 12A and 12B are cross-sectional views illustrating a portion of the electronic device of FIG. 2, taken along plane A according to various embodiments.

The window glasses 320-7 to 320-8 and the coating layer 410 shown in FIGS. 12A and 12B may be identical or similar to the window glasses 320, 320-1, and 320-2 and the coating layer 410 shown in FIGS. 5A, 5B and 5C and 10A and 10B. Accordingly, description of the same components may not be repeated here.

Although the window glasses 320-7 to 320-8 shown in FIGS. 12A and 12B have the 2D shape, embodiments of the window glasses 320-7 and 320-8 are not limited to the 2D shape, but may rather include embodiments for the 2.5D shape and the 3D shape.

Referring to FIG. 12A, according to various embodiments, the coating layer 410 may be disposed on the edge of the window glass 320-7. According to an embodiment, the coating layer 410 may be disposed to be attached to at least a portion of the first chamfered surface 322, the side surface 323, and/or at least a portion of the second chamfered surface 324. According to an embodiment, the coating layer 410 may be disposed in a dam-like shape. According to an embodiment, the coating layer 410 may be disposed in a dome-like shape.

According to various embodiments, as the coating layer 410 is disposed on at least a portion of the first chamfered surface 322 of the window glass 320-7, the side surface 323, and/or at least a portion of the second chamfered surface 324, it is possible to prevent and/or reduce entry of external contaminants into the electronic device 101 and damage to the electronic device 101 due to external impact.

According to various embodiments, the coating layer 410 disposed on the window glass 320-8 may serve as a bezel. An area in which the coating layer 410 is disposed may be referred to as a bezel area 710. An area where a screen is output between the bezel areas 710 disposed at two opposite lengthwise and/or widthwise ends of the electronic device 101 may be referred to as a display area 720.

According to various embodiments, the size of the bezel area 710 may vary depending on the thickness of the coating layer 410 disposed on the first chamfered surface 322, the side surface 323, and/or the second chamfered surface 324. According to an embodiment, as the thickness of the coating layer 410 formed on the first chamfered surface 322, the side surface 323, and/or the second chamfered surface 324 of the window glass 320-7 increases, the size of the bezel area 710 may increase. According to an embodiment, if the thickness of the coating layer 410 formed on the first chamfered surface 322, the side surface 323, and/or the second chamfered surface 324 of the window glass 320-7 decreases, the size of the bezel area 710 may decrease.

According to various embodiments, in the limited size of the electronic device 101, the display area 720 may decrease in size if the size of the bezel area 710 increases and increase in size if the size of the bezel area 710 reduces.

According to various embodiments, as only the coating layer 410 is disposed to be attached to the first chamfered surface 322, side surface 323, and second chamfered surface 324 of the front display 320-7, the bezel area 710 may decrease in size while the display area 720 may increase in size. Accordingly, the screen-to-body ratio (SBR) which is a ratio of the output area of the display 330 to the overall area of the electronic device 101 may increase. An increase in SBR allows the user to use a larger display 330. It is thus possible to enhance usability and use convenience.

Referring to FIG. 12B, according to various embodiments, the coating layer 410 may be disposed on the edge of the window glass 320-8. According to an embodiment, the coating layer 410 may be disposed to be attached to at least a portion of the rear surface 321, the first chamfered surface 322, the side surface 323, and/or at least a portion of the second chamfered surface 324. According to an embodiment, the coating layer 410 may be disposed in a dam-like shape. According to an embodiment, the coating layer 410 may be disposed in a dome-like shape.

According to various embodiments, as the coating layer 410 is disposed on at least a portion of the rear surface 321, the first chamfered surface 322, the side surface 323, and/or at least a portion of the second chamfered surface 324 of the window glass 320-8, it is possible to prevent and/or reduce entry of external contaminants into the electronic device 101 and damage to the electronic device 101 due to external impact.

According to various embodiments, the coating layer 410 disposed on the window glass 320-8 may serve as a bezel. An area in which the coating layer 410 is disposed may be referred to as a bezel area 710. An area where a screen is output between the bezel areas 710 disposed at two opposite lengthwise and/or widthwise ends of the electronic device 101 may be referred to as a display area 720.

According to various embodiments, the size of the bezel area 710 may vary depending on the length of the coating layer 410 disposed on at least a portion of the rear surface 321 and the thickness of the coating layer 410 disposed on the first chamfered surface 322, the side surface 323, and/or the second chamfered surface 324. According to an embodiment, if the length of the coating layer 410 formed on the rear surface 321 of the window glass 320-8 increases, the size of the bezel area 710 may increase. According to an embodiment, if the length of the coating layer 410 formed on the rear surface 321 of the window glass 320-8 decreases, the size of the bezel area 710 may decrease.

According to various embodiments, in the limited size of the electronic device 101, the display area 720 may decrease in size if the size of the bezel area 710 increases and increase in size if the size of the bezel area 710 reduces.

According to various embodiments, as only the coating layer 410 is disposed to be attached to the rear surface 321, the first chamfered surface 322, side surface 323, and second chamfered surface 324 of the front display 320-7, the bezel area 710 may decrease in size while the display area 720 may increase in size. Accordingly, the screen-to-body ratio (SBR) which is a ratio of the output area of the display 330 to the overall area of the electronic device 101 may increase. An increase in SBR allows the user to use a larger display 330. It is thus possible to enhance usability and use convenience.

According to various embodiments, the coating layer 410 and the printed layer 420 may be disposed to be attached to the widthwise edge as well as the lengthwise edge of the window glass 320 in the same and/or similar manner. Accordingly, a cross section taken along plane A perpendicular to the lengthwise direction of the electronic device 101 may be identical and/or similar to a cross section taken along a plane perpendicular to the widthwise direction of the electronic device 101.

Figure 13:
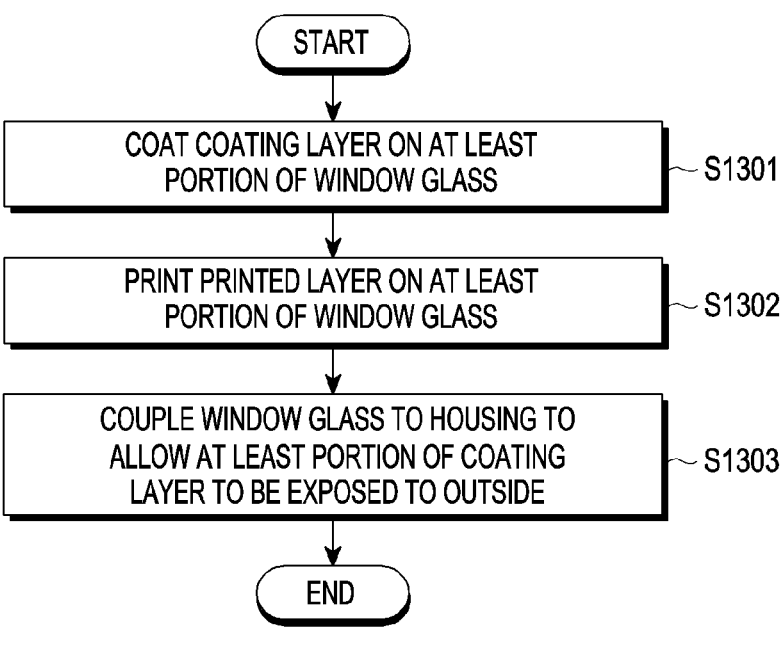
FIG. 13 is a flowchart illustrating an example process for manufacturing a window glass of an electronic device according to various embodiments.

FIG. 13 is a flowchart illustrating an example process for manufacturing a window glass of an electronic device according to various embodiments.

The window glass 320, the coating layer 410, and the printed layer 420 described in connection with FIG. 13 may be identical or similar to the window glass 320, the coating layer 410 and the printed layer 420 shown in FIGS. 5A, 5B, 5C, 6, 7, 8, 9A, 9B, 10A, 10B, 11A, 11B, 11C, 11D, 12A and 12B. Accordingly, description of the same components may not be repeated here.

Referring to FIG. 13, according to various embodiments, the coating layer 410 may be coated on at least a portion of the window glass 320 having a 2D shape, a 2.5D shape, and/or a 3D shape (S1301). According to an embodiment, the coating layer 410 may be coated on at least a portion of at least one of the rear surface 321, the first chamfered surface 322, the side surface 323, the second chamfered surface 324, and/or the front surface 325 of the window glass 320. According to an embodiment, the coating layer 410 may be coated by the coating device 510.

According to various embodiments, the printed layer 420 may be printed on at least a portion of the window glass 320 coated with the coating layer 410 (S1302). According to an embodiment, the printed layer 420 may be printed on at least a portion of at least one of the rear surface 321, the first chamfered surface 322, the side surface 323, and/or the second chamfered surface 324. According to an embodiment, the printed layer 420 may be printed by the printing device 520. According to various embodiments, the printed layer 420 may be printed to contact the coating layer 410.

According to various embodiments, the printed layer 420 may include a first printed layer 421, a second printed layer 422, and/or a third printed layer 423. The first printed layer 421 may be disposed to contact the window glass 320, the second printed layer 422 may be disposed to contact the first printed layer 421, and the third printed layer 423 may be disposed to contact the second printed layer 422. The length of the third printed layer 423 may be shorter than the length of the second printed layer 422, and the length of the second printed layer 422 may be shorter than the length of the first printed layer 421. Accordingly, the first printed layer 421, the second printed layer 422, and the third printed layer 423 may be formed in a stepped structure.

According to various embodiments, the window glass 320 coated with the coating layer 410 and/or the window glass 320 coated with the coating layer and printed with the printed layer 420 may be coupled to the housing 310 of the electronic device 101 so that at least a portion of the coating layer 410 may be exposed to the outside of the electronic device 101 (S1303). According to an embodiment, the coating layer 410 and/or the printed layer 420 of the window glass 320 may be disposed adjacent to the side bezel structure 318 of the electronic device 101.

According to various example embodiments of the disclosure, an electronic device (the electronic device 101 of FIG. 4) may comprise: a housing (the housing 310 of FIG. 3), a window glass (the window glass 320 of FIG. 5C) coupled to the housing and including a front surface (the front surface 325 of FIG. 5C), a rear surface (the rear surface 321 of FIG. 5C) disposed in parallel with at least a portion of the front surface, a side surface (the side surface 323 of FIG. 5C), a first chamfered surface (the first chamfered surface 322 of FIG. 5C) extending from the rear surface to the side surface, and a second chamfered surface (the second chamfered surface 324 of FIG. 5C) extending from the front surface to the side surface, a coating layer (the coating layer 410 of FIG. 5C) coated on at least a portion of the second chamfered surface, and a printed layer (the printed layer 420 of FIG. 5C) printed on at least a portion of the rear surface. A least a portion of the coating layer may be exposed to an outside.

According to various example embodiments, the printed layer may be disposed to contact a side surface of the coating layer.

According to various example embodiments, the printed layer may include a first printed layer (the first printed layer 421 of FIG. 5C), a second printed layer (the second printed layer 422 of FIG. 5C), and a third printed layer (the third printed layer 423 of FIG. 5C). The first printed layer may contact the rear surface, the second printed layer may contact the first printed layer, and the third printed layer may contact the second printed layer.

According to various example embodiments, the second printed layer may be shorter in length than the first printed layer, and the third printed layer may be shorter in length than the second printed layer.

According to various example embodiments, the coating layer may to be equal to or greater in height than the printed layer.

According to various example embodiments, the coating layer may include an elastic material.

According to various example embodiments, at least a portion of the front surface of the window glass may include a curve.

According to various example embodiments, at least a portion of an edge of the window glass may be bent.

According to various example embodiments, the coating layer is disposed inside a virtual extension line (the virtual extension line 3201 of FIG. 5B) of the front surface of the window glass.

According to various example embodiments, the coating layer and the printed layer may overlap each other when viewed in a direction perpendicular to the side surface.

According to various example embodiments of the disclosure, a method for manufacturing an electronic device (the electronic device 101 of FIG. 4) including a housing (the housing 310 of FIG. 3) and a window glass (the window glass 320 of FIG. 5C) coupled to the housing and including a front surface (the front surface 325 of FIG. 5C), a rear surface (the rear surface 321 of FIG. 5C) disposed in parallel with at least a portion of the front surface, a side surface (the side surface 323 of FIG. 5C), a first chamfered surface (the first chamfered surface 322 of FIG. 5C) extending from the rear surface to the side surface, and a second chamfered surface (the second chamfered surface 324 of FIG. 4) extending from the front surface to the side surface may comprise: coating a coating layer (the coating layer 410 of FIG. 5C) on at least a portion of the second chamfered surface, printing a printed layer (the printed layer 420 of FIG. 5C) on at least a portion of the rear surface, and coupling the window glass to the housing. At least a portion of the coating layer may be exposed to an outside.

According to various example embodiments, the printed layer may include a first printed layer (the first printed layer 421 of FIG. 5C), a second printed layer (the second printed layer 422 of FIG. 5C), and a third printed layer (the third printed layer 423 of FIG. 5C).

According to various example embodiments, the first printed layer may contact the rear surface, the second printed layer may contact the first printed layer, and the third printed layer may contact the second printed layer.

According to various example embodiments, the third printed layer may be shorter in length than the second printed layer, and the second printed layer may be shorter in length than the first printed layer.

According to various example embodiments, at least one of the coating layer and the printed layer may be disposed adjacent to a side bezel structure (the side bezel structure 318 of FIG. 8) of the electronic device.

According to various example embodiments, an electronic device (101 of FIG. 4) may comprise: a housing (the housing 310 of FIG. 3) and a window glass (the window glass 320 of FIG. 12A) coupled to the housing and including a front surface (the front surface 325 of FIG. 12A), a rear surface (the rear surface 321 of FIG. 12A) disposed in parallel with at least a portion of the front surface, a side surface (the side surface 323 of FIG. 12A), a first chamfered surface (the first chamfered surface 322 of FIG. 12A) extending from the rear surface to the side surface, and a second chamfered surface (the second chamfered surface 324 of FIG. 12A) extending from the front surface to the side surface, and a coating layer (the coating layer 410 of FIG. 12A) coated on at least a portion of the second chamfered surface and at least a portion of the side surface. At least a portion of the coating layer may be exposed to an outside.

According to various example embodiments, the coating layer may include an elastic material.

According to various example embodiments, at least a portion of the front surface of the window glass may include a curve.

According to various example embodiments, the coating layer is disposed inside a virtual extension line (the virtual extension line 3201 of FIG. 5B) of the front surface of the window glass.

According to various example embodiments, the coating layer may be coated on at least a portion of at least one of the first chamfered surface and the rear surface.

While the disclosure has been illustrated and described with reference to various example embodiments thereof, it will be understood that the various example embodiments are intended to be illustrative, not limiting. It will be further apparent to those of ordinary skill in the art that various changes in form and detail may be made without departing from the true spirit and full scope of the disclosure, including the following claims and their equivalents. It will also be understood that any of the embodiment(s) described herein may be used in conjunction with any other embodiment(s) described herein.

What is claimed is:

1. An electronic device comprising:
    a housing;
    a window glass coupled to the housing and including a front surface, a rear surface disposed in parallel with at least a portion of the front surface, a side surface, a first chamfered surface extending from the rear surface to the side surface, and a second chamfered surface extending from the front surface to the side surface;
    a coating layer coated on at least a portion of the second chamfered surface; and
    a printed layer printed on at least a portion of the rear surface, wherein at least a portion of the coating layer is exposed to an outside, and
    wherein the coating layer includes an elastic material and is greater in height than the printed layer.

2. The electronic device of claim 1, wherein the printed layer contacts a side surface of the coating layer.

3. The electronic device of claim 1,
    wherein the printed layer includes a first printed layer, a second printed layer, and a third printed layer, and
    wherein the first printed layer contacts the rear surface, the second printed layer contacts the first printed layer, and the third printed layer contacts the second printed layer.

4. The electronic device of claim 3, wherein the second printed layer is shorter in length than the first printed layer, and the third printed layer is shorter in length than the second printed layer.

5. The electronic device of claim 1, wherein at least a portion of the front surface of the window glass includes a curve.

6. The electronic device of claim 1, wherein at least a portion of an edge of the window glass bent.

7. The electronic device of claim 1, wherein the coating layer is disposed inside a virtual extension line of the front surface of the window glass.

8. The electronic device of claim 1, wherein the coating layer and the printed layer overlap each other when viewed in a direction perpendicular to the side surface.

9. A method for manufacturing an electronic device including a housing; and
    a window glass coupled to the housing and including a front surface, a rear surface disposed in parallel with at least a portion of the front surface, a side surface, a first chamfered surface extending from the rear surface to the side surface, and a second chamfered surface extending from the front surface to the side surface, the method comprising:
    coating a coating layer on at least a portion of the second chamfered surface;
    printing a printed layer on at least a portion of the rear surface; and
    coupling the window glass to the housing,
    wherein at least a portion of the coating layer is exposed to an outside, and
    wherein the coating layer includes an elastic material and is greater in height than the printed layer.

10. The method of claim 9, wherein the printed layer includes a first printed layer, a second printed layer, and a third printed layer.

11. The method of claim 10, wherein the first printed layer contacts the rear surface, the second printed layer contacts the first printed layer, and the third printed layer contacts the second printed layer.

12. The method of claim 11, wherein the third printed layer is shorter in length than the second printed layer, and the second printed layer is shorter in length than the first printed layer.

13. The method of claim 9, wherein at least one of the coating layer and the printed layer is disposed adjacent to a side bezel structure of the electronic device.

14. An electronic device comprising:
    a housing;
    a window glass coupled to the housing and including a front surface, a rear surface disposed in parallel with at least a portion of the front surface, a side surface, a first chamfered surface extending from the rear surface to the side surface, and a second chamfered surface extending from the front surface to the side surface;
    a printed layer printed on at least a portion of the rear surface; and
    a coating layer coated on at least a portion of the second chamfered surface and at least a portion of the side surface, wherein at least a portion of the coating layer is exposed to an outside, and wherein the coating layer includes an elastic material and is greater in height than the printed layer.

15. The electronic device of claim 14, wherein at least a portion of the front surface of the window glass includes a curve.

16. The electronic device of claim 14, wherein the coating layer is disposed inside a virtual extension line of the front surface of the window glass.

17. The electronic device of claim 14, wherein the coating layer is coated on at least a portion of at least one of the first chamfered surface and the rear surface.

* * * * *